(12) United States Patent
Madden et al.

(10) Patent No.: US 10,724,908 B2
(45) Date of Patent: Jul. 28, 2020

(54) FLEXIBLE TRANSPARENT SENSOR WITH IONICALLY-CONDUCTIVE MATERIAL

(71) Applicant: UNIVERSITY OF BRITISH COLUMBIA, Vancouver (CA)

(72) Inventors: John David Wyndham Madden, Vancouver (CA); Mirza S. Sarwar, Vancouver (CA)

(73) Assignee: UNIVERSITY OF BRITISH COLUMBIA, Vancouver, BC (CA)

( * ) Notice: Subject to any disclaimer, the term of this patent is extended or adjusted under 35 U.S.C. 154(b) by 279 days.

(21) Appl. No.: 15/532,983

(22) PCT Filed: Dec. 3, 2015

(86) PCT No.: PCT/CA2015/051265
§ 371 (c)(1),
(2) Date: Jun. 2, 2017

(87) PCT Pub. No.: WO2016/086306
PCT Pub. Date: Jun. 9, 2016

(65) Prior Publication Data
US 2017/0356812 A1    Dec. 14, 2017

Related U.S. Application Data

(60) Provisional application No. 62/087,126, filed on Dec. 3, 2014.

(51) Int. Cl.
*G06F 3/044*    (2006.01)
*H03K 17/955*   (2006.01)
(Continued)

(52) U.S. Cl.
CPC .............. *G01L 1/144* (2013.01); *G01L 1/146* (2013.01); *G01L 1/148* (2013.01); *G06F 3/044* (2013.01);
(Continued)

(58) Field of Classification Search
None
See application file for complete search history.

(56) References Cited

U.S. PATENT DOCUMENTS

| | | | | |
|---|---|---|---|---|
| 4,293,734 A | * | 10/1981 | Pepper, Jr. .............. | A63F 13/06 178/18.01 |
| 8,612,856 B2 | * | 12/2013 | Hotelling .............. | G06F 3/0485 715/702 |

(Continued)

FOREIGN PATENT DOCUMENTS

WO    WO 2012/170399 A2    12/2012

OTHER PUBLICATIONS

Mannsfeld, Stefan C.B.; Highly sensitive flexible pressure sensors with microstructured rubber dielectric layers; Nature Materials; Oct. 2010; vol. 9: 859-864.

(Continued)

*Primary Examiner* — Natalie Huls
*Assistant Examiner* — Jermaine L Jenkins
(74) *Attorney, Agent, or Firm* — Kilpatrick Townsend & Stockton LLP

(57) ABSTRACT

A sensor comprises conductive elements arranged and connected for proximity sensing. The conductive elements are formed of an ionically conductive polymer. The sensor may also include conductive elements arranged and connected for touch sensing. The conductive elements may be connected to an alternating-current (AC) source. Another sensor comprises one or more conductive elements arranged and connected for touch sensing by detecting resistivity changes in the one or more conductive elements. A flexible and transparent sensor is also provided, which comprises a layer of a piezoelectric polymer and conductive elements in contact with the layer for transmitting an electric signal (Continued)

generated by compression of the layer. Methods and processes for using such sensors are also provided.

19 Claims, 28 Drawing Sheets

(51) Int. Cl.
  *H03K 17/975* (2006.01)
  *G01L 1/14* (2006.01)
  *H03K 17/96* (2006.01)
  *G06F 3/041* (2006.01)
  *G01V 3/08* (2006.01)

(52) U.S. Cl.
  CPC ......... *G06F 3/0416* (2013.01); *H03K 17/955* (2013.01); *H03K 17/962* (2013.01); *H03K 17/975* (2013.01); *G01V 3/081* (2013.01); *G06F 2203/04102* (2013.01); *G06F 2203/04103* (2013.01); *G06F 2203/04111* (2013.01); *H03K 2217/960775* (2013.01)

(56) References Cited

U.S. PATENT DOCUMENTS

| | | | | |
|---|---|---|---|---|
| 8,730,199 | B2* | 5/2014 | Sleeman | G01L 1/146 345/173 |
| 8,920,174 | B2* | 12/2014 | Tachi | G09B 21/003 340/4.11 |
| 8,937,607 | B2* | 1/2015 | Brown | G06F 3/044 345/174 |
| 9,582,124 | B2* | 2/2017 | Han | G06F 3/0412 |
| 9,766,757 | B2* | 9/2017 | Keller | H03K 17/962 |
| 9,933,888 | B2* | 4/2018 | Kim | G06F 3/0414 |
| 2009/0194344 | A1* | 8/2009 | Harley | G06F 3/044 178/18.06 |
| 2010/0079401 | A1* | 4/2010 | Staton | G06F 3/044 345/174 |
| 2010/0289503 | A1 | 11/2010 | Reynolds | |
| 2010/0309162 | A1* | 12/2010 | Nakanishi | G06F 3/044 345/174 |
| 2011/0007030 | A1* | 1/2011 | Mo | G06F 3/044 345/174 |
| 2013/0257785 | A1 | 10/2013 | Brown | |

OTHER PUBLICATIONS

Jeong-Yun Sun, et al; Ionic Skin; Advanced Materials; Oct. 2014; vol. 26, No. 45, pp. 7608-7614.
Jeong-Yun Sun, et al; Ionic Skin; Advanced Materials; Sep. 30, 2014; vol. 26, No. 45.
Supplementary European Search Report of EP App. 15 86 5607, dated Jun. 28, 2018.
Owen, J; Ionic Conductivity; Electrical Conductivity of Comprehensive Polymer Science and Supplements; 1996; vol. 2; 669-686.
Bloor, D; Electrical Conductivity; Electrical Conductivity of Comprehensive Polymer Science and Supplements: 1996; vol. 2; 687-705.
Keplinger, C et al; Stretchable, Transparent, Ionic Conductors; Science, 2013, 341(6149), 984-987.
Buenger, et al; Hydrogels in sensing applications; Progress in Polymer Science; 37 (2012) 1678-1719.
Calvert; Gel sensors and actuators; MRS Bulletin; 2008; 33 (3), 207-212.
Li; Kinetics of smart hydrogels responding to electric field: A transient deformation analysis; International Journal of Solids and Structures; 46 (2009) 1326-1333.
European Patent Office; Communication pursuant to Article 94(3) EP in EP Appl. No. 15865607.4; dated Nov. 29, 2019.

* cited by examiner

| 3.78 | 3.93 | 4.54 | 3.19 |
|------|------|------|------|
| 4.39 | 4.51 | 5.54 | 5.48 |
| 2.88 | 3.38 | 4.38 | 4.09 |
| 3.31 | 3.81 | 4.17 | 3.61 |

FIG. 4E

| 4.23 | 4.88 | 4.77 | 4.04 |
|------|------|------|------|
| 4.95 | 6.04 | 6.91 | 6.75 |
| 5.30 | 7.93 | 11.49 | 8.33 |
| 3.60 | 6.15 | 8.41 | 6.61 |

FIG. 4F

FLEXIBLE TRANSPARENT SENSOR WITH IONICALLY-CONDUCTIVE MATERIAL

RELATED APPLICATIONS

This application is a § 371 National Phase Application of PCT/CA2015/051265, filed Dec. 3, 2015, which application claims priority to U.S. patent application No. 62/087,126 filed on Dec. 3, 2014, the contents of which are incorporated herein by reference in their entirety for all purposes herein.

FIELD

The present invention relates generally to sensors and sensing methods, and particularly to sensors and sensing methods based on flexible and transparent materials.

BACKGROUND

Flexible and transparent sensors have a wide variety of applications. For example, such sensors may be used on electronic devices, such as display and input devices, and wearable or implantable electronic devices. These sensors also have applications in medical or healthcare industries.

Commonly used flexible and transparent conductive materials include thin metal strips, wires, or nanotubes, or very thin metal coatings. Silver nanowire has been found suitable for use in capacitive sensor touch panels or touch sensor films. Indium tin oxide (ITO) has also been used as conductive materials in inflexible and transparent sensors. Highly transparent ITO can have sheet resistance above $100\Omega/\square$. The sheet resistance of an ITO material can be as low as 30 to $40\Omega/\square$ when its transparency is in the range of 83 to 88%. Typically, these conductive materials conduct electrical currents or transmit signals by way of electron movement in the material. However, these materials have some limitations and drawbacks and efforts have been made to find replacement or alternative conductive materials.

Sun et al. discloses an ionic skin used as a pressure sensor, which includes ionic conductors formed from acrylamide (AAm) based hydrogels. The sensor can detect pressure of touch by a finger on the ionic skin. See Sun et al., "Ionic skin," *Advanced Materials*, first published online Oct. 29, 2014, DOI:10.100$^2$/adam.201403441 (referred to as "Sun" hereinafter). In an ionic conductor, electrical signals are transmitted due to ion movement within the conductor. Sun notes that its ionic skin is highly strethchable, transparent, and biocompatible, and can be used to monitor larger deformation such as that generated by bending of a finger. It is reported to be able to detect stimuli with a wide dynamic range (strains from 1% to 500%), and to measure pressure as low as 1 kPa. A sheet of distributed sensors covering a large area can report the location and pressure of touch. High transparency allows transmission of electrical signal without impeding optical signals.

SUMMARY

In an aspect of the present invention, there is provided a sensor comprising a plurality of conductive elements arranged and connected for proximity sensing, wherein said conductive elements are formed of an ionically conductive polymer. The sensor may further comprise a plurality of conductive elements arranged and connected for touch sensing. The conductive elements for touch sensing may be formed of the ionically conductive polymer. The conductive elements for proximity sensing may be provided in a first layer, and the conductive elements for touch sensing may be provided in a second layer under the first layer. Each one of the first and second layers may be elastic and has a transparency of more than 90% and an electric resistance of less than $200\Omega/\square$. The conductive elements may be arranged one adjacent to another on a substrate for proximity sensing based on a change in fringing electric field over said conductive elements, and said conductive elements may be connected to an alternating-current (AC) source. The sensor may further comprise a dielectric layer, wherein a first set of said plurality of conductive elements are arranged above said dielectric layer, and a second set of said plurality of conductive elements are arranged below said dielectric layer opposite to respective ones of said first set of conductive elements, thereby forming a plurality of capacitors. The capacitors may be connected for proximity sensing based on a decrease of a capacitance of a respective capacitor. The dielectric layer may be elastic, and the capacitors may be further connected for touch sensing based on an increase of the capacitance of the respective capacitor caused by compression of said dielectric layer at said respective capacitor.

In another aspect of the present invention, there is provided a sensor comprising one or more conductive elements arranged and connected for touch sensing by detecting resistivity changes in said one or more conductive elements, wherein said one or more conductive elements are formed of a transparent ionically conductive polymer, and are connected to an alternating-current (AC) source.

In further aspect of the present invention, there is provided a flexible and transparent sensor comprising: a layer of a piezoelectric polymer; a plurality of conductive elements in contact with said layer for transmitting an electric signal generated by compression of said layer, wherein said conductive elements are formed of an ionically conductive polymer.

In a sensor described herein the conductive elements may be formed of ionically conductive material or polymer, such as an ionically conductive hydrogel. The hydrogel may comprise polyacrylamide or a polyurethane. The hydrogel may comprise a fluid electrolyte. The conductive elements may be encapsulated to prevent loss of the fluid electrolyte. The ionically conductive material may comprise a non-volatile electrolyte, or a solid electrolyte. The ionically conductive material may be substantially free of water. The ionically conductive material may comprise a salt. The conductive elements may be configured and connected to conduct an alternating-current (AC). The sensor may be flexible. The sensor may be stretchable. The sensor may be transparent.

Methods and processes for using and operating the sensors are also disclosed.

Other aspects, features, and embodiments of the present invention will become apparent to those of ordinary skill in the art upon review of the following description of specific embodiments of the invention in conjunction with the accompanying figures.

BRIEF DESCRIPTION OF THE DRAWINGS

In the figures, which illustrate, by way of example only, embodiments of the present invention:

FIGS. 4E and 4F are capacitance maps for a 4×4 electrode array according to an embodiment disclosed herein, showing changes in capacitance resulting from a hovering object and a "light touch", respectively;

DETAILED DESCRIPTION

Mutual Capacitance

This disclosure relates in part to sensors relying on mutual capacitance. Mutual capacitance refers to sensing by a capacitor formed by two adjacent electrodes. The fringe electric field between the electrodes may be decoupled by the presence of an external object, which causes a decrease in capacitance of the capacitor formed by these electrodes.

A "proximity sensor" as used herein is a sensor that can sense an object (e.g. a finger) as it approaches or hovers in the vicinity of a surface. A "light touch" sensor as used herein is a sensor that can sense contact of a surface by an object. A "touch sensor", or "pressure sensor", as used herein refers to a sensor that can be used to detect and/or quantify pressure being applied to a surface by an object (e.g. a finger).

Figure 1:
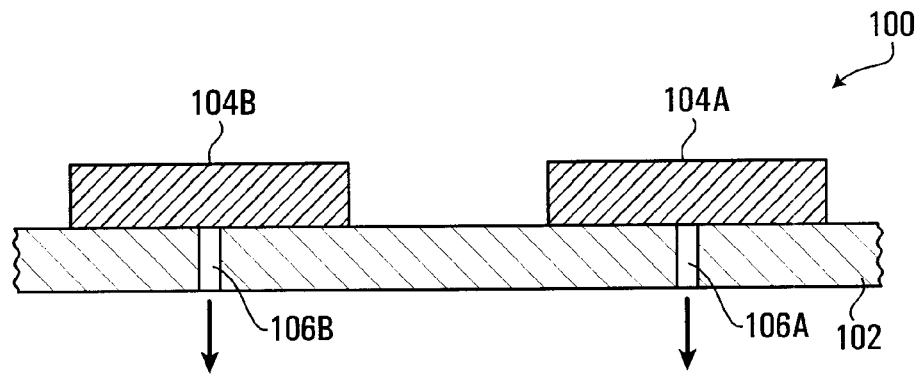
FIG. 1 is a schematic cross-sectional elevation view of a proximity sensor, illustrative of an embodiment of the present invention.

In a selected embodiment, a proximity sensor 100 is provided, as illustrated in FIG. 1. Sensor 100 includes a substrate 102, and a plurality of conductive elements disposed thereon (collectively or individually referred to as 104). In FIG. 1, only two conductive elements 104A and 104B are shown. However, it should be understood that additional conductive elements 104 may be formed on the same substrate 102. Each conductive element 104 is connected for proximity sensing, such as through an electrode 106A, 106B as illustrated in FIG. 1, and as will be further described below.

Substrate 102 may be formed of any suitable substrate material. In selected embodiments, substrate 102 is formed of a flexible and transparent insulating polymer. Substrate 102 may be formed of a dielectric material. For example, it may be formed of an acrylic elastomer, such as VHB™ 4905 available from 3M™. A polydimethylsiloxane (PDMS) may be used to form substrate 102. Substrate 102 may also be formed of an elastomer, such as a transparent dielectric elastomer. Examples of suitable elastomers include elastic polyester materials, silicone-based elastomers, natural or synthetic rubbers, or the like. Substrate 102 may also be formed of a fabric material such as one based on nylon, wool, cotton, or polyester, or other fibrous materials.

Conductive elements 104 are formed of an ionically conductive material. The ionically conductive material may be flexible, stretchable and transparent.

A flexible material refers to a material that is readily bendable by hand, to a radius of curvature of less than about 200 mm. A flexible thin material may be bendable by hand to a radius of about 1 to 10 mm, or even to a diameter of about 100 μm.

A stretchable material refers to a material that can be substantially elongated by hand. The material may be elastic so the elongation is substantially reversible when the stretching force is removed. For example, a stretchable material may be reversibly elongated by hand by more than at least 1%, more than 5%, or more than 10%. Suitable stretchable materials may be stretched by more than 100%. Some hydrogels may be stretched by up to 21 times of their original length.

For a flexible and stretchable material, its elastic modulus should be less than 10 GPa, especially when some bending is required, with little stretching, and typically below 50 MPa for applications where high stretch and compliance are required. The elastic modulus could be as low as about 5 kPa for some applications where extreme compliance is desired.

A transparent material refers to a material that that has a transparency of more than about 90% is desired particularly when the sensors are used over good quality display devices.

The ionically conductive material may have a sheet resistance of less than 1Ω/□. In some embodiments, suitable ionically conductive materials may have sheet resistance of up to 1000 Ohms per square (100 micrometers thick, 10 S/m conductivity), or up to 10,000 Ohms per square or more, depending on the materials and electrolytes used.

For example, the ionically conductive material may be a polymer, such as an ionically conductive hydrogel, which may be formed from a polyacrylamide or a polyurethane. The hydrogel may include an electrolyte for providing conducting ions. In some applications, a salt such as NaCl or KCl, may be included in the hydrogel for providing conducting ions. The electrolyte may be dissolved in a solvent such as water. Depending on the polymer used for the hydrogel, other solvents including propylene carbonate, acetonitrile and other organic solvents may also be suitable. In some applications, a pure ionic liquid may be used to provide the electrolyte, in which case a solvent is not necessary. Suitable ionic liquids may include 1-ethyl-3-methylimidazolium bis(trifluoromethylsulfonyl)imide (EMI TFSI).

In some applications, the hydrogel may be prepared by soaking a polyurethane hydrogel in a KCl solution. The KCl solution may have a concentration of 1.0 M. The hydrogel may contain 90% water and may have a sheet resistance of about 167 Ω/□.

A specific suitable hydrogel may have a transparency excluding surface reflection of 98.9%, and a thickness of 11 mm. The hydrogel may be stretchable by 21 times of its original length without rupture, and may have a tensile strength of 2.5 MPa.

Suitable ionically conductive materials also include Nafion (a sulfonated tetrafluoroethylene based fluoropolymer-copolymer), Flemion (perfluorinated carboxylic acid membrane), agar, cationic and anionic membranes, and gels including natural gels based on chitosan.

Suitable cationic ion exchange membranes include Aciplex k-192, Selemion CMV, Nafion, FKS, Flemion, FKD, CR61-CMP, Ralex CM-PES, PC-SK, Morgane CDS, Neosepta CM1, TWCED or the like.

Suitable anionic ion exchange membranes include Aciplex A-192, Selemion AMV, FAS, FAB, Ralex MH-PES, Morgane ADP, Neosepta AM1, TWEDG, or the like.

The conductive elements 104 are arranged and connected so that each adjacent pair forms a capacitor, and a fringing electric field extending between each pair of adjacent conductive elements is generated when an electric voltage is applied across the capacitor. Conductive elements 104 may be arranged as an array of parallel strips, or in another pattern.

Electrode 106A, 106B may be formed of any suitable conductive material. It may be formed of the same material as the material in conductor elements 104, or it can be formed of a metal, such as a stainless steel wire, copper wire, gold wire or silver wire. It is used to connect the conductive elements 104 to an electrical circuit (not shown in FIG. 1, but see FIGS. 1A and 1B) for applying the required current/voltage to the sensor, and analysing the electrical signal generated by the sensor. The location and arrangement of these electrodes may vary in different embodiments. For example, in some embodiments, connection electrodes may be provided above substrate 102. Metal connection electrodes form an electrochemical double layer interface with the ionic conductors. This interface is typically at the edge of the substrate when transparency and stretch are required. The ionic conductor then acts as the interconnect to the capacitor(s) on the substrate.

A proximity sensor as used herein refers to a sensor that detects the presence of an object in the proximity of the sensor without any physical contact between the sensor and the object. A proximity sensor is a kind of a tactile sensor.

In use, an alternating-current (AC) electrical voltage from an AC source is applied to each pair of conductive elements 104A and 104B through electrodes 106A, 106B respectively. The capacitance between the pair may be measured through electrodes 106A, 106B using a suitable device, such as illustrated in FIG. 1A.

Figure 1A:
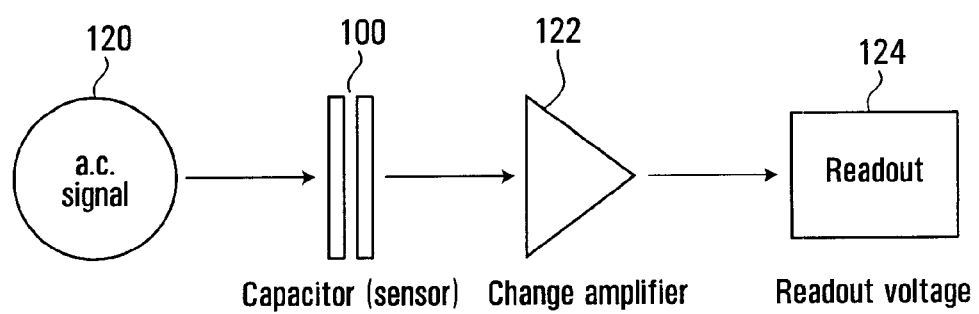
FIGS. 1A and 1B are schematic circuit diagrams illustrating operation of the sensor of FIG. 1.

As illustrated in FIG. 1A, an AC Source 120 may be connected to the capacitive sensor (sensor 100 in this case) to apply an AC signal (voltage) to one of the conductive elements 104A, 104B (which functions as the drive electrode or transmitter electrode). The other electrode conductive element then functions as the sense electrode or the receiver electrode. For illustration purposes, it is assumed that conductive element 104A is the connected to the AC Source 120 and conductive element 104B is connected to a charge amplifier 122. It should be understood that the capacitor connection can be reversed. Amplifier 122 is connected to a readout device 124, which may include a memory (not separately shown) for storing data and software, and a processor (not separately shown) for processing data. The electric signal received from the sensor 100 is amplified by amplifier 122 and the amplified signal is received and processed by readout device 124.

Figure 1B:
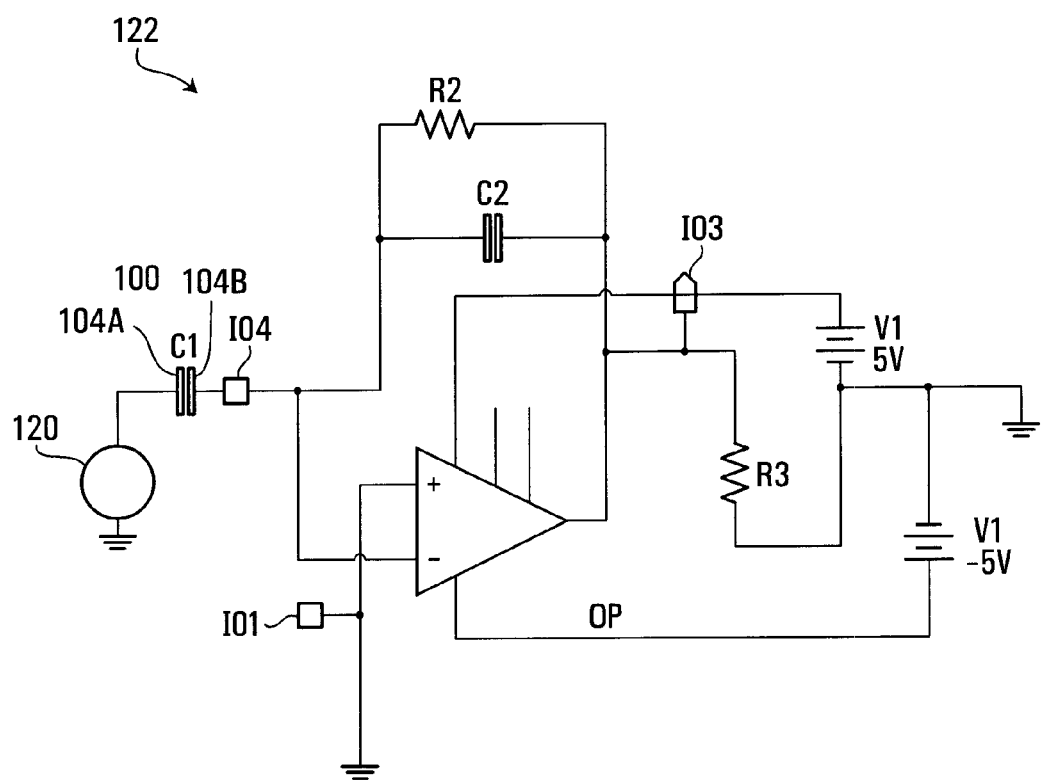

A possible implementation of charge amplifier 122 is shown in FIG. 1B. Terminal IO4 of amplifier 122 is connected to the "sense electrode" (conductive element 104B in this case) of the capacitor sensor 100. The positive input terminal IO1 is grounded and a negative feedback is provided through capacitor C2. The amplification gain is mainly the ratio of C1 to C2. Resistor R2 in the negative feedback is provided mainly to reduce input bias current build-up effects. R3 is a load resistor at the output terminal IO3, which is connected to the readout device 124. V1 and V2 are direct current (DC) power sources providing the required operating voltages and electrical power.

Depending on the level of coupling of electric field between the drive and sense electrodes at capacitor sensor 100, the output voltage at the output terminal IO3 can increase or decrease. Since the signal applied to sensor 100 is an AC signal, a rectifier (not shown) may be provided at the output terminal IO3 of the amplifier 122, so that changes in the magnitude of the alternating voltage can be converted to shifts in the level of the rectified signal, which may be easier to process and interpret by the readout device 124 and its driver software.

The skilled person will understand that other well established methods of measuring the capacitance may be used, including the delta-sigma type capacitance to digital converter utilizing a $\Delta$–$\Sigma$ ADC. This allows sensors to be easily integrated into existing devices.

Figure 2A:
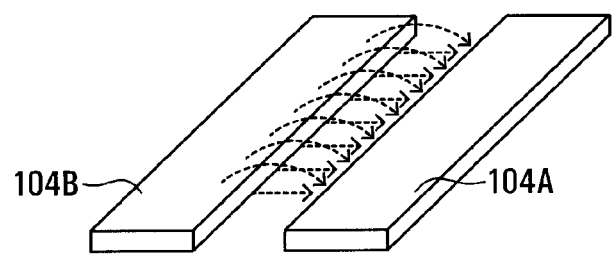
FIGS. 2A, 2B and 3 are schematic diagrams illustrating operation of the sensor of FIG. 1.
Figure 2B:
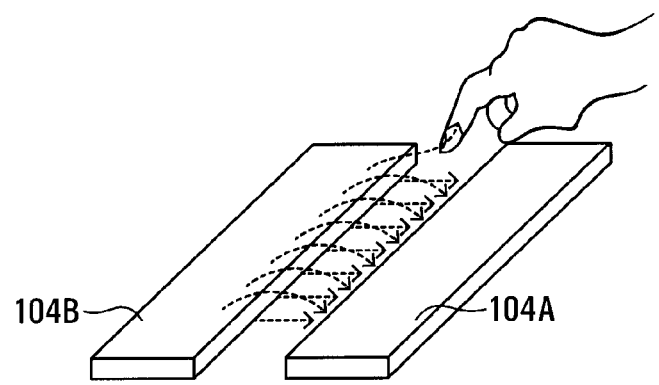

Due to the arrangement of the conductive elements 104A, 104B and application of the AC voltage from AC Source 120, a fringing electric field is produced which extends above sensor 100, as illustrated by the dashed-lines in FIG. 2A. When an external object, such as a human finger, comes within the proximity of conductive elements 104A and 104B, and disturbs the fringing electric field, as illustrated in FIG. 2B, the capacitance of the capacitor formed by conductive elements 104A and 104B changes.

Figure 3:
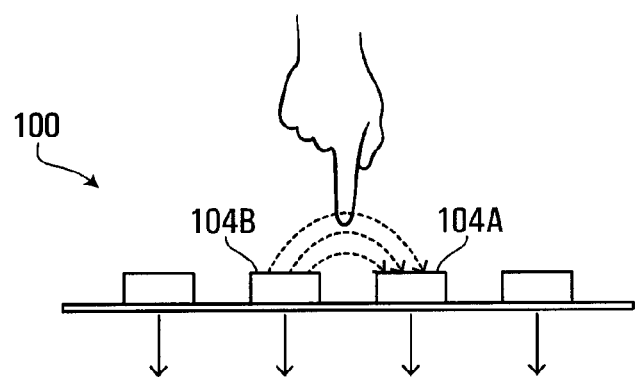

Specifically, without being limited to any specific theory, it can be expected that when the finger, or any other object, is sufficiently close to conductive elements 104A and 104B, conductive elements 104A and 104B are increasingly coupled with the finger, and coupling between conductive elements 104A and 104B decreases, resulting in a reduction in the capacitance of the capacitor formed by conductive elements 104A and 104B. Such reduction in capacitance can be detected through electrodes 106A, 106B. This is also illustrated in FIG. 3, which illustrates that bringing a finger close to the conductive elements 104A and 104B affects the capacitor formed by the conductive elements by affecting the field. This changes the capacitance, which is communicated to a readout circuit. Thus, sensor 100 can function as a proximity sensor, which exploits the change in mutual capacitance between two adjacent conductive elements to detect the presence of an object nearby.

Figure 4A:
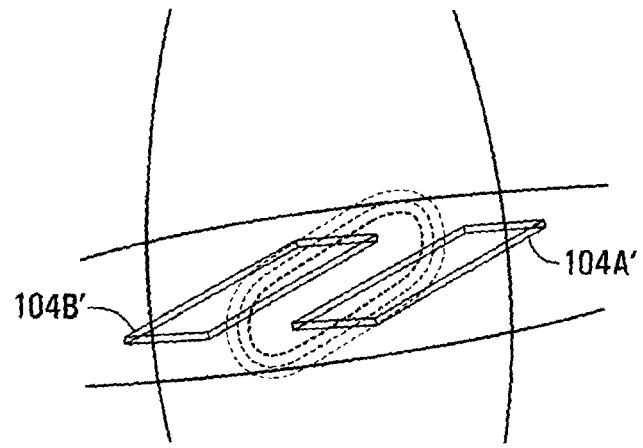
FIGS. 4A and 4B are representations of computer simulation images illustrating electric field distribution around conductive elements.
Figure 4B:
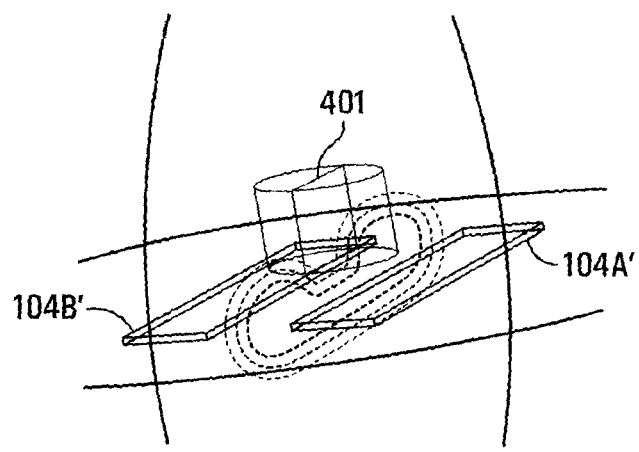

This working principle was verified with a computer simulation model. A representative result is illustrated in FIGS. 4A and 4B. FIG. 4A shows the simulated electric field strength contours around two simulated conductive elements 104A' and 104B', undisturbed by any external object. FIG. 4B shows the simulated electric field distribution when a cylindrical object 401 is placed near conductive elements 104A' and 104B'. The cylindrical object 401 is simulated to have a relative permittivity of 80 (similar to that of a human finger). The simulation results indicated that that the electric field flux in the plane between the two conductive elements 104A' and 104B' decreased as the cylindrical object 401 approached.

Figure 4C:
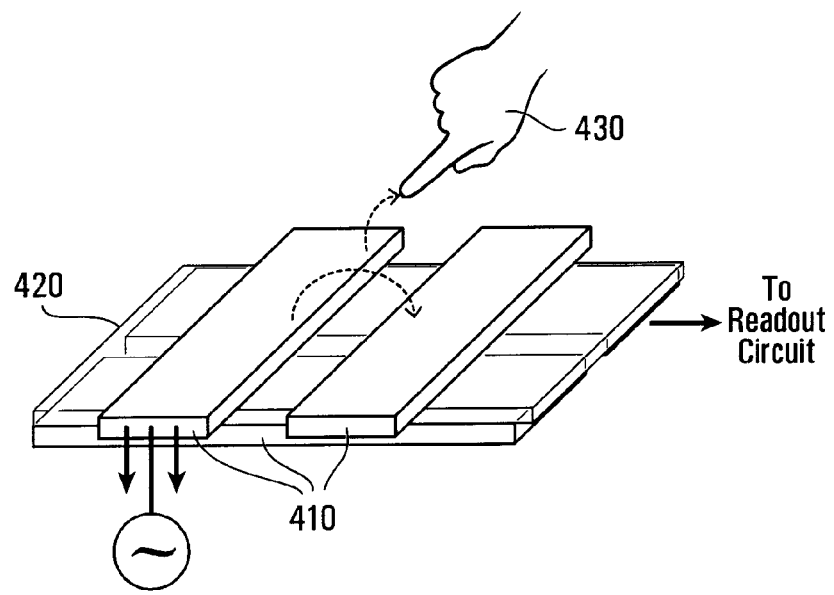
FIGS. 4C and 4D are schematic perspective views of multilayered sensors illustrative of embodiments disclosed herein.
Figure 4D:
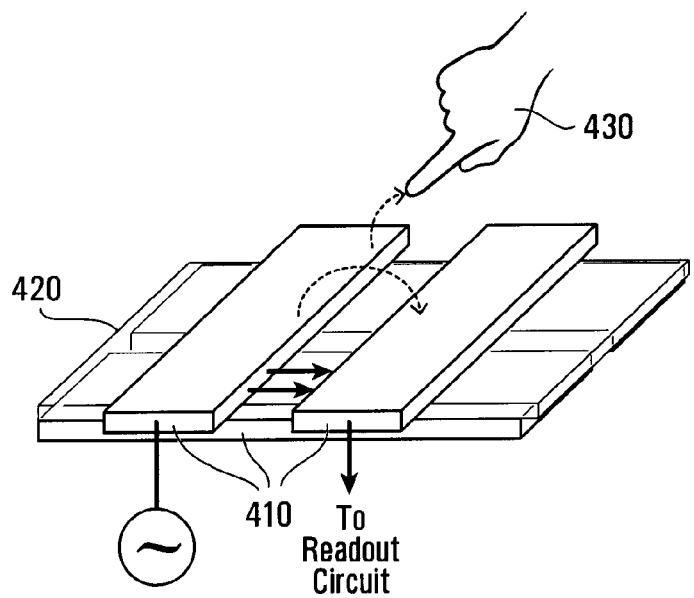

In some embodiments, a proximity sensor may include a first array of parallel sensing strips (row strips) laid over a second array of parallel sensing strips (column strips), thus forming an x-y grid on a substrate sheet, as can be understood by those skilled in the art. Such a grid allows the location of the object near the sensor to be precisely identified by the x-y coordinates and allows tracking of the movement of the object over the sensor sheet. At least two topologies are possible. FIG. 4C illustrates an embodiment where most of the electric field (represented by downward arrows) coupling between conductive elements 410 is through dielectric 420 and the fringe field (represented by curved arrows) at the edges may be manipulated to obtain both proximity and "light touch" sensing of an object, e.g. finger 430 (As indicated later in this disclosure, this same embodiment may be further used to detect a touch or pressure as an increase in capacitance upon deformation of the dielectric when a pressure is applied versus a decrease in capacitance in case of a proximity or light touch). Alternatively, as illustrated in FIG. 4D, the electric field (represented by horizontal arrows) coupling between the electrodes 410 may be primarily along the edge and overhead, thereby presenting a larger exposed field (represented by curved arrows) for manipulation by the test object (e.g. finger 430) to be detected. This may bring about a larger change in capacitance. However, because the coupling is along the entire length of the electrodes (i.e. a few centimeters), an object about 1 cm in diameter will decouple a small fraction of the entire field.

Where there is an array of electrodes, the $\Delta C/C_o$ [$(C_{new} - C_{old})/C_{old}$] for each intersecting point for the perpendicular electrode topology can be mapped as depicted in FIG. 4E, which a shows a map for a 4×4 electrode array (showing 16 points or taxels) and the location of a finger hovering at 4 mm above the surface of the sensor. As can be seen from the map, a hovering object provides the largest change in capacitance in the cell, on top of which the hovering finger was located. The neighboring cells have a change slightly smaller than the change in the activated/excited cell.

FIG. 4F shows a map for a finger lightly touching a location on the same sensor. A light touch by an object results in a larger change in capacitance relative to a hovering object, and the difference in change of capacitance value between the excited cell and adjacent cell is much greater. A firm "touch" or "pressure" will deform the dielectric and bring about an increase in capacitance versus a decrease in capacitance for a proximity or light touch, which can be used to detect a touch and differentiate between the three, i.e. proximity (hover), a "light touch" and a firm touch (i.e. pressure).

Figure 4G:
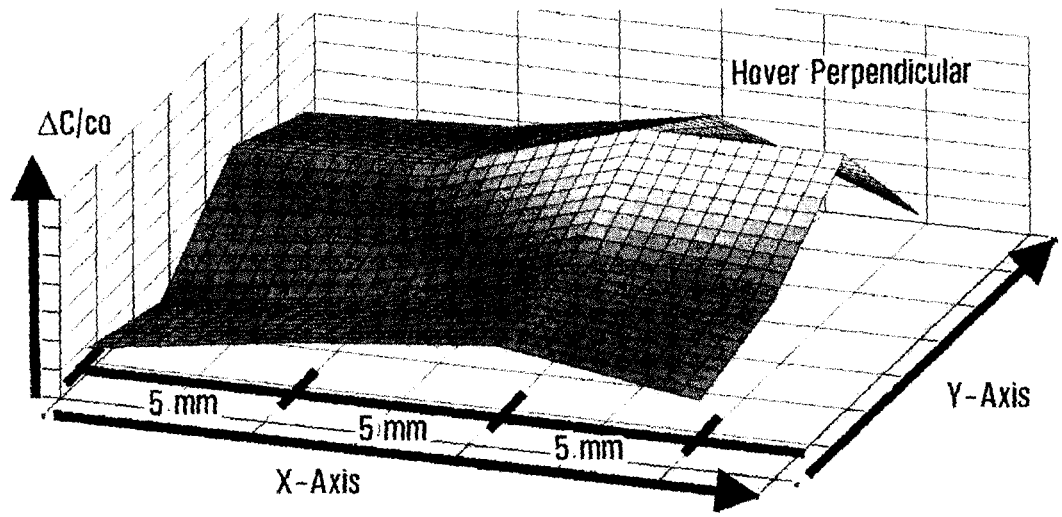
FIGS. 4G and 4H are surface plots of capacitance for a 4×4 electrode array according to an embodiment disclosed herein, showing changes in capacitance resulting from a hovering object and a "light touch", respectively.
Figure 4H:
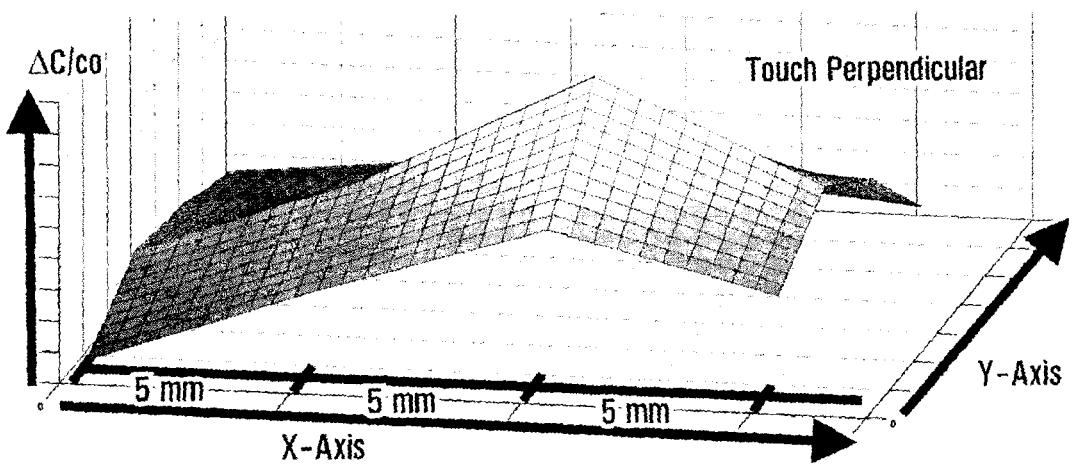

FIG. 4G and FIG. 4H are two surface plots that further demonstrate the same results elicited by a hovering object and a lightly touched object. A slight bump is observed in $\Delta C/C_o$ map for a hovering object in FIG. 4G, and a sharp peak is observed for a touch in FIG. 4H.

In a selected embodiment, proximity sensor 100 may be combined with, e.g. overlaid with, a touch sensor to provide both proximity sensing and touch sensing. Conveniently, the touch sensor may also be formed using an ionically conductive polymer. The combination sensor allows discrimination between the hovering or approach of a finger from a tap, and between bending and deformation of the sensor film itself from approach of a finger, hence an enhanced form of sensor than a simple proximity sensor, or a simple touch sensor.

Figure 5:
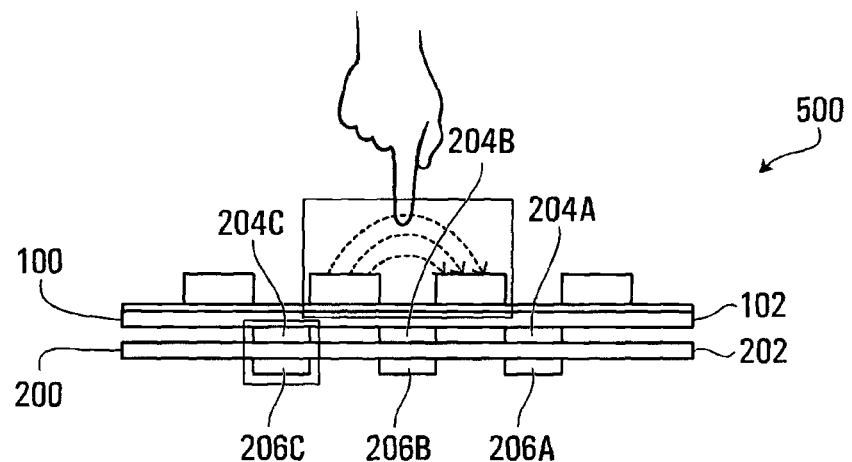
FIG. 5 is a schematic cross-sectional view of a combination sensor, illustrative of an embodiment of the present invention.

In some embodiments, the touch sensing layer may be formed with a touch sensor as disclosed in Sun. An example of such a commination sensor, sensor 500 is illustrated in FIG. 5. Sensor 500 includes proximity sensor 100 laid on top of a touch sensor 200.

Touch sensor 200 includes a flexible, transparent dielectric layer 202, which may be formed of the same material as for substrate 102. Pairs of conductive elements 204 and 206 are disposed above and below layer 202 to form a plurality of capacitors, each formed of a pair of conductive elements, such as 204A and 206A, 204B and 206B, or 204C and 206C, and the dielectric layer portion sandwiched therebetween.

The touch sensor 200 may have a capacity response ($\Delta C/C_0$) of about 0.04 for an applied pressure of 2 kPa, where $\Delta C$ refers to the change in capacitance and $C_0$ refers to the initial or baseline capacitance.

In use, sensor 500 may be operated by separately applying electric signals to each of sensor 100 and sensor 200 with one or more signal sources, such as AC source 120, and processing the generated signals with separate readout devices, such as one similar to the circuit and readout device shown in FIG. 1A. Each of sensor 100 and sensor 200 may be used and operated as the capacitor (C1) illustrated in FIGS. 1A and 1B. It can be understood that for the touch sensor 200, the drive electrode for capacitor C1 may be the top conductive elements 204 and the sense electrode for capacitor C1 may be the bottom conductive elements 206. That is, conductive elements 204 are connected to AC source 120 and conductive elements 206 are connected to amplifier 122. Alternatively, the connection of the touch sensor 200 to the AC source 120 and the amplifier 122 may be reversed.

In some embodiments, a single readout circuit may be used to operate multiple sensors by time-division mutiplexing (TDM), as can be understood by those skilled in the art.

The processing of the detected signal will be further discussed in more detail below.

Figure 6:
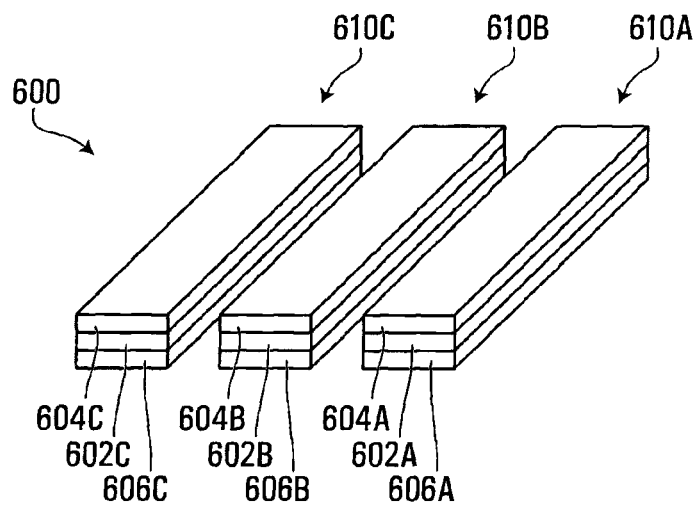
FIG. 6 is a schematic perspective view of another combination sensor, illustrative of an embodiment of the present invention.

In another selected embodiment, a combination sensor 600 is formed as illustrated in FIG. 6. Sensor 600 includes a plurality of sensing elements 610A, 610B, 610C (also collectively and individually referred to as 610). Each sensing element 610 includes a dielectric layer 602A, 602B, 602C (also collectively and individually referred to as 602), sandwiched between a top conductive element 604A, 604B, 604C (also collectively and individually referred to as 604) and a bottom conductive element 606A, 606B, 606C (also collectively and individually referred to as 606). Dielectric layer 602 is formed of the same material as layer 202. Conductive elements 604, 606 are formed of the same material as conductive elements 104, 204, 206. Electric contacts, electrodes, or wires (not shown in FIG. 6 but see e.g. electrodes 106 in FIG. 1) may be provided to apply an electrical voltage and transmit electric signals from sensing elements 610 to a readout circuit. The sensing elements are configured and connected to a readout circuit (not shown in FIG. 6 but see FIG. 1A) configured to detect both increase and decrease in capacitance of the respective sensing elements 610.

In use, a voltage is applied across each sensing element 610, which forms a capacitor. A capacitance of each capacitor may be measured. An electric field also extends above each sensing element 610. As can be appreciated, sensing element 610 may be connected and operated as illustrated in FIGS. 1A and 1B in the place of the capacitor C1.

Figure 6A:
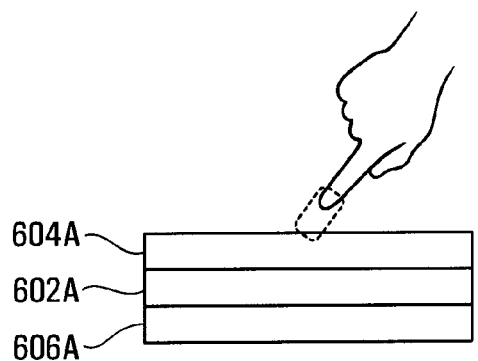
FIGS. 6A and 6B are schematic cross-sectional views of a sensing element in the sensor of FIG. 6, illustrating its operation.

As illustrated in FIG. 6A, when a finger is placed near or lightly touches a particular sensing element, e.g., sensing element 610A, and disturbs the electric field above conductive element 604A, the capacitance of the sensing element 610A decreases. Thus, when a decrease in capacitance is detected, it can be determined that an external object such as a finger is in the proximity of the sensing element 610A before the finger touches the sensing element 601A (such that sensor 600 can function as a proximity sensor) or is lightly touching the sensing element.

Figure 6B:
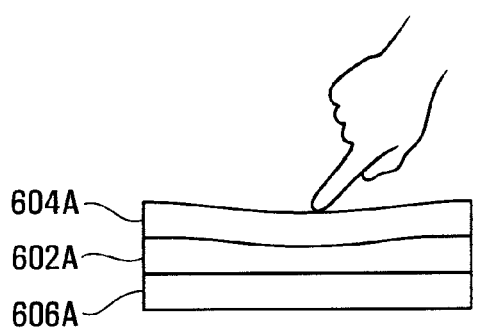

As illustrated in FIG. 6B, if the finger continues to move toward the sensing element 610A and touches it to apply a pressure to physically deform sensing element 610A, specifically conductive element 604A and dielectric layer 602A, the thickness of dielectric layer 602A decreases under compression. As a result, the capacitance of the sensing element 604A increases. Thus, when an increase in capacitance is detected, it can be determined that the sensing element 610A has been touched by the finger. Sensor 600 can therefore also function as a touch sensor. Thus, the sensing element can function as a proximity sensor, a light touch sensor, and a touch (i.e. pressure) sensor.

As illustrated in FIG. 6, sensing elements 610 may be formed with an array of conductive elements aligned parallel to one another.

Figure 7:
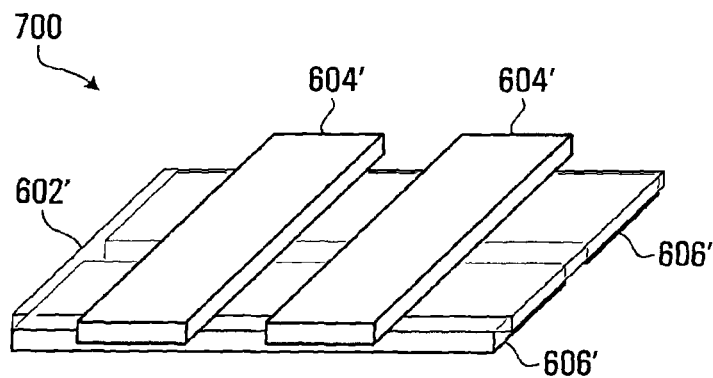
FIG. 7 is a schematic perspective view of a sensor array, illustrative of an embodiment of the present invention.

In an alternative embodiment, as illustrated by sensor 700 in FIG. 7, the top conductive elements may be arranged as an array of column conductive elements 604', and the bottom conductive elements may be arranged as an array of row conductive elements 606'. Further, the dielectric layer 602' between the top and bottom conductive elements may be formed of a single sheet. Each pair of overlapping conductive elements 604', 606' may be connected and operated as a sensor element 610.

To enhance the pressure sensitivity, a sensor as depicted in FIG. 6A may be provided with a micro-structured dielectric as known in the art (e.g. as described by Mannsfeld et al, Nature Materials 9, 859-864), which provides for a greater effective pressure being applied for an applied pressure. This increases the sensitivity of the sensor, thus bringing about a greater change in capacitance for a given pressure.

Figure 8:
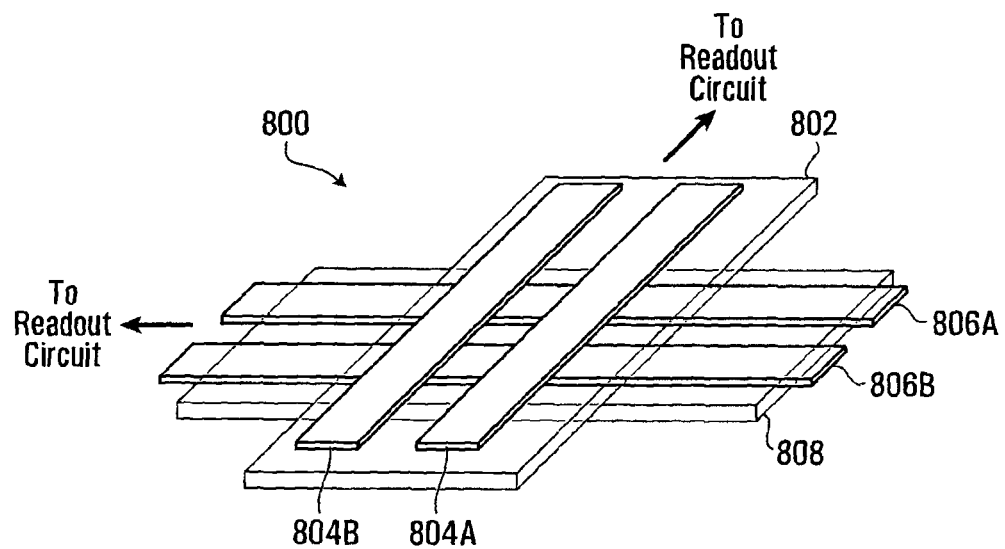
FIG. 8 is a schematic perspective view of a sensor similar to that of FIG. 7 illustrating its operation.

FIG. 8 illustrates another sensor arrangement 800, which provides both proximity sensing and touch sensing. Sensor arrangement 800 includes a top layer and a bottom layer. The top layer includes conductive elements 804 (804A, 804B) disposed on a dielectric substrate 802. The bottom layer includes conductive elements 806 (806A, 806B) disposed on a dielectric substrate 808. Each of the top and bottom layers may be constructed as sensor 100.

As can be understood, the top layer of arrangement 800 may be operated as sensor 100 for proximity sensing, for example, by applying an AC signal to conductive element 804A and detect a capacitance signal from conductive element 804B, as discussed above and illustrated in FIGS. 1A, 1B, 2A and 2B.

Further, each overlapping pair of conductive elements 804 and 806 may be also be connected and operated for touch sensing, similar to the operation of sensor 200.

Therefore, sensor arrangement 800 can be operated to provide both proximity sensing and touch sensing.

Figure 9:
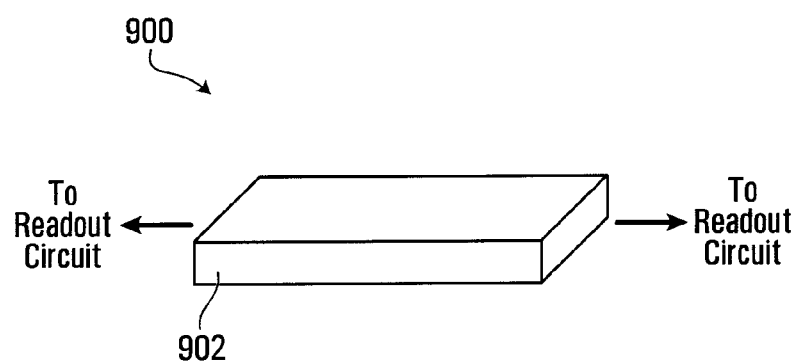
FIG. 9 is a schematic perspective view of a resistive sensor, illustrative of an embodiment of the present invention.

FIG. 9 schematically illustrates another sensor 900. Sensor 900 includes a conductive element 904 configured and connected to detect a change in resistivity in the conductive element 904. Conductive element 902 is formed of the same material as for conductive elements 104, 204, 206.

Piezoresistive sensors can detect change in resistance due to deformation of the sensor material. In the present context, a local change in resistance can be used to detect touch. As can be understood and will be further described below, sensor 900 can also be used in a hybrid (or combination) sensor to determine the extent of touch or proximity.

The gauge factor ($\Delta R/R$ divided by strain—a key figure of merit for piezoresistive sensors) in such a sensor may be about 2. However, because the ionic conducting layers can be extremely compliant, only a very small touch pressure may be needed in order to generate a relatively large change in resistance.

Figure 9A:
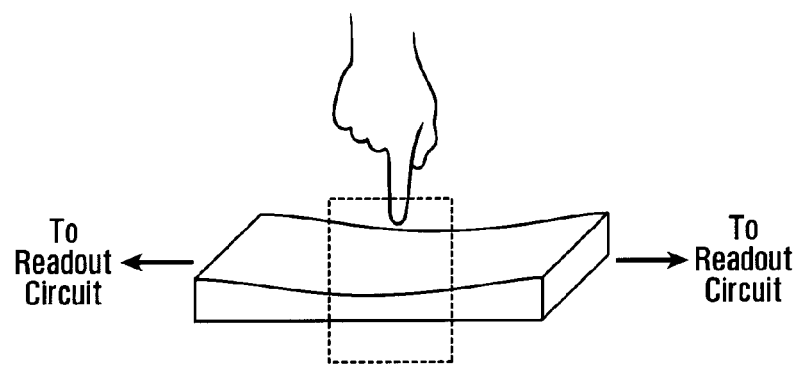
FIG. 9A is a schematic perspective view of the sensor of FIG. 9 in operation.
Figure 9B:
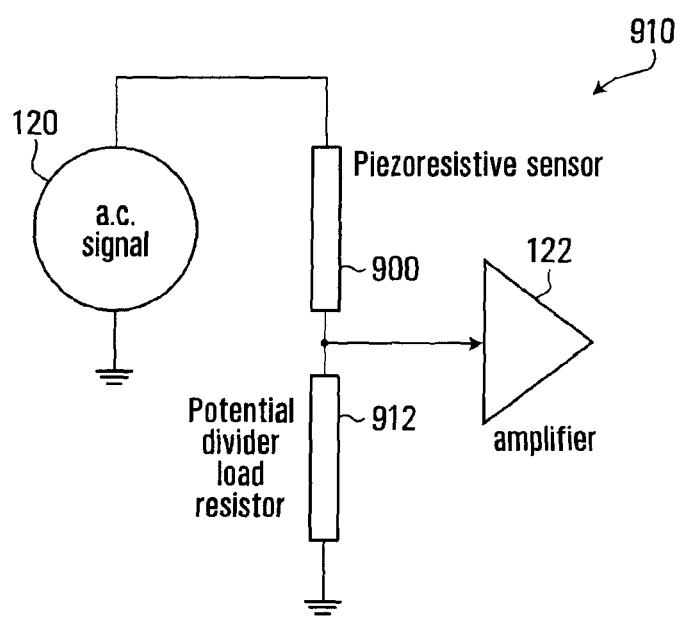
FIG. 9B is a schematic circuit diagram illustrating operation of the sensor of FIG. 9.

In use, as illustrated in FIGS. 9A and 9B, sensor 904 may be connected to an AC source, such as AC Source 120, and to an optional amplifier such as amplifier 122 in a potential divider circuit 910. A potential divider load resistor 912 is provided. Amplifier 122 is connected to a signal processing circuit (not shown) for processing the amplified signal. An alternating-current (AC) is passed through conductive element 904, and its resistivity can be measured. When conductive element 904 is touched and deformed by an external object such as a human finger, the resistance of conductive element 904 changes, which may be detected by detecting a change in either the current through conductive element 904, or the voltage drop across load resistor 910, by the signal processing circuit connected to amplifier 122. As can be appreciated, sensor 900 is a touch sensor.

In some embodiments, sensor 900 may be used as the touch sensor in a combination sensor with both proximity sensing and touch sensing. For example, touch sensor 200 in sensor 500 may be replaced with touch sensor 900.

Figure 10:
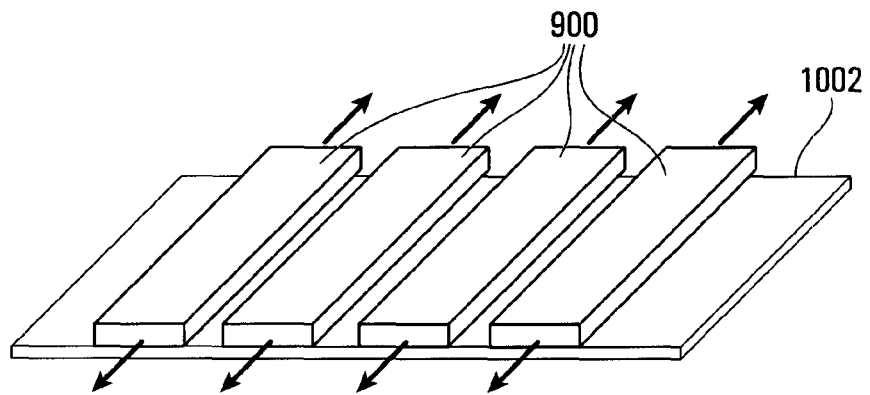
FIG. 10 is a schematic perspective view of a resistive sensor array, illustrative of an embodiment of the present invention.

A plurality of sensors 900 may be arranged as an array of parallel sensing elements to detect the location of a touch or tap along a one dimensional space, as illustrated in FIG. 10, where a sensor 1000 includes four sensor elements, each being a sensor 900, arranged in parallel on a dielectric substrate 1002. Sensor elements 900 are electrically isolated from one another. Each sensor element is connected to be read independently (arrows depict communication to read-out circuit) and to be uniquely identified by a read-out circuit such as circuit 910, so it is possible to determine the location of the sensor element that has changed resistivity and thus the location of the touch. Substrate 1002 may be formed of the same material as for substrate 102.

Two sensor arrays may be cross-overlaid to form a sensing matrix.

Figure 11:
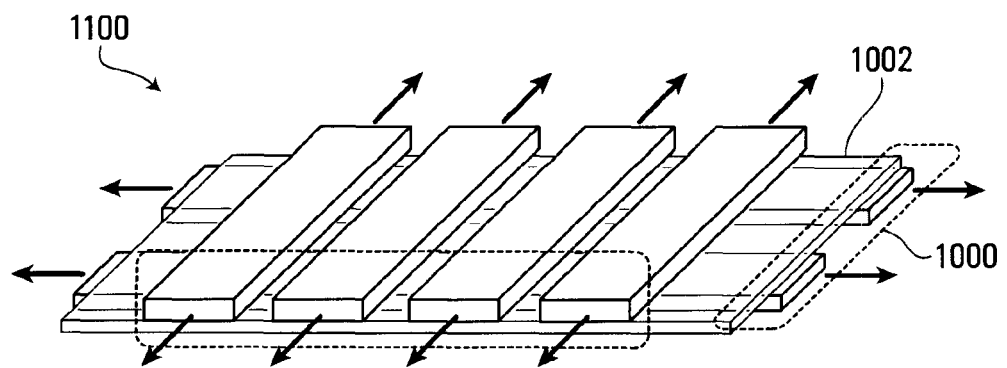
FIG. 11 is a schematic perspective view of an arrangement of overlaid resistive sensor arrays, illustrative of an embodiment of the present invention.

An example is illustrated in FIG. 11, which is a sensor 1100 formed of two cross-overlaid sensors 1000, with the bottom sensor only partially shown. This arrangement allows detection of the location of the touch in a two dimensional coordinate system. As illustrated, only the ends of each sensing strip needs to be connected to the readout circuit (not shown in FIG. 11, but see FIG. 9B) (arrows depict communication to readout circuit). The middle portion of sensor 1100 may thus be conveniently formed entirely of transparent materials.

Figure 12:
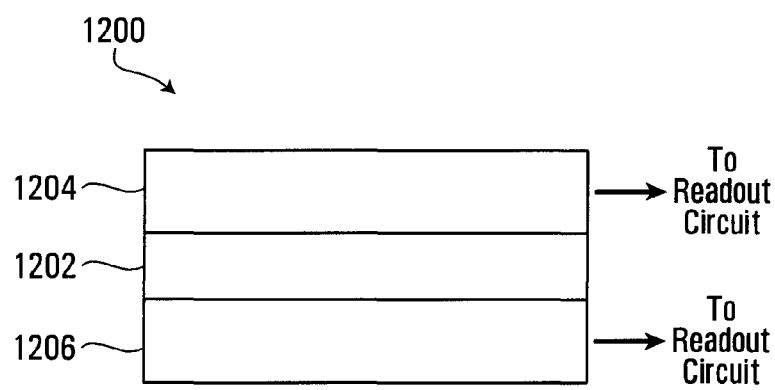
FIG. 12 is a schematic cross-sectional view of a piezoelectric sensor, illustrative of an embodiment of the present invention.

Another embodiment of a touch sensor or sensing element is schematically illustrated in FIG. 12. As shown, a sensing element 1200 may have a structure similar to that of sensing elements 610 shown in FIG. 6 but the middle dielectric layer 602 is replaced with a piezoelectric material, which is also flexible and transparent. Layers 1204 and 1206 are similar to conductive elements 604 and 606.

In some applications, layer 1202 may be formed of a polydimethylsiloxane (PDMS). In other applications, other suitable flexible and transparent piezoelectric polymers or materials may be used.

Sensing element 1200 is connected and used differently as compared to sensing elements 610. In particular, sensing element 1200 is connected to a circuit (not shown in FIG. 12 but see FIG. 12B) for detecting any local charge accumulation due to piezoelectric effect. Piezoelectric sensor materials are polarized so that when a force is applied to the material a voltage is generated. An example piezoelectric material is PVDF (polyvinylidene difluoride). Other piezoelectric materials may also be used.

Figure 12A:
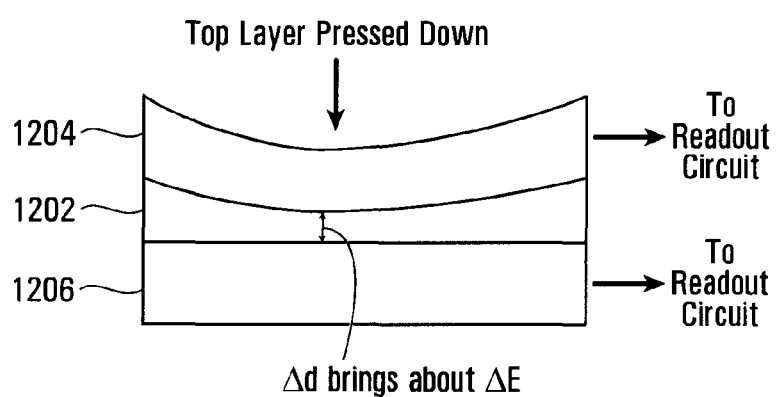
FIG. 12A is a schematic cross-sectional view of the piezoelectric sensor of FIG. 12 in operation.

As illustrated in FIG. 12A, application of a pressure (represented by vertical arrow) on sensing element 1202 causes compression of the piezoelectric material in layer 1202, which in turn generates charges and charge separation due to the piezoelectric effect. The separation of positive and negative charges produces an electric field ($\Delta E$), and a non-zero electric voltage across layer 1202 between layers 1204 and 1206. When, for example, layers 1204 and 1206 are connected with a voltage meter (not shown) to measure the voltage across the two layers, a tap on sensor 1200 can result in a voltage change on the voltage meter. Alternatively, if layers 1204 and 1206 are serially connected with a current meter (not shown), a tap on sensor 1200 can result in a current reading on the current meter.

Figure 12B:
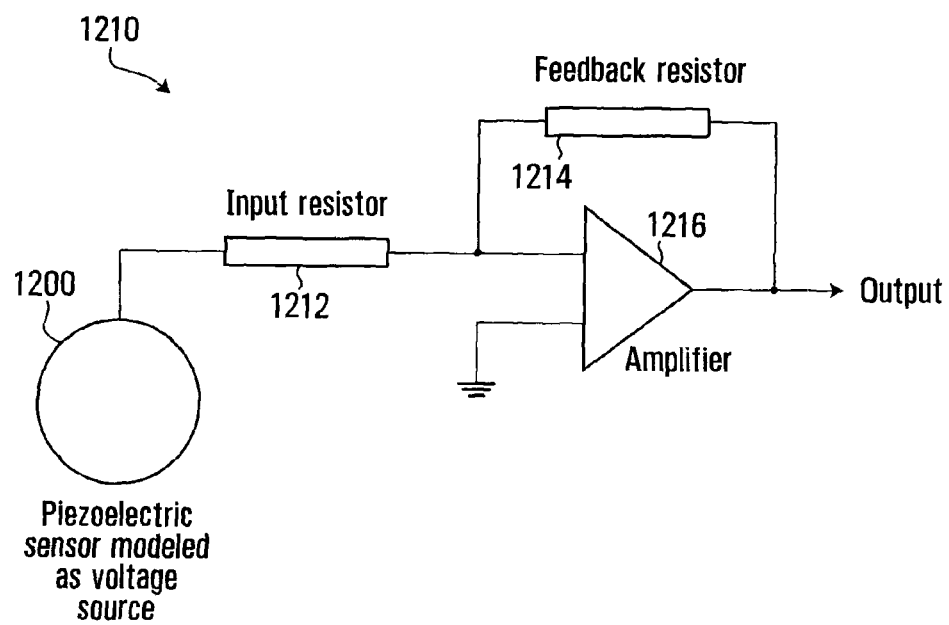
FIG. 12B is a schematic circuit diagram illustrating operation of the sensor of FIG. 12.

FIG. 12B illustrates a circuit 1210 for operating sensor 1200. In circuit 1210, sensor 1200 is modelled as a voltage source, and is connected to an input resistor 1212, a feedback resistor 1214 and an amplifier 1216. The output from circuit 1210 is connected to a signal processing circuit or device (not shown), which may have a driver software installed thereon for analyzing the received signal. Amplifier 1216 is a simple negative feedback voltage amplifier, and can amplify the voltage generated by sensor 1200.

As can be appreciated by those skilled in the art, the sensors described herein may be formed of materials that are sufficiently flexible and transparent so that the sensor may be formed into sheets that are conformal to complex geometries. The materials may also be relatively inexpensive. The materials may be selected such that sensor sheets of large sizes are relatively convenient and easy to fabricate.

A sensor disclosed herein may be used in flexible electronics and hand held devices, or in an artificial skin for robotics applications. The sensors may be made biocompatible by selecting specific ionically conductive hydrogels as the conductive elements and using NaCl as the salt for the electrolyte. It is expected that suitable materials can be selected so as to embed such sensors into an artificial skin for replacing a human skin. The sensors may also be applied to the surface of the skin for medical applications or for entertainment applications. For example, the touch or proximity sensors, or hybrid sensors with both proximity and touch sensing can be used as part of a drug dispensing patch to enable user or physician input for control of dosage. It may be used as an arm-band for interactions with users of a mobile music system such as an iPod™ or phone. With the use of biocompatible materials, it is expected that sensors disclosed herein can find various applications in the medical field.

The sensor materials disclosed herein may also be used in accelerometers. For example, a mass may be attached to a touch sensor or hybrid sensor disclosed herein to form an accelerometer. The sensor material itself may act as a combined spring and damper. When the mass is accelerated, it applies a force to the sensor material. The sensor material is deformed by the applied force (e.g. stretched or compressed) and generates an electric signal. For example, in the case of a piezoelectric sensor material, movement of the mass in any direction can produce a voltage in the sensor material. Alternatively, the capacitance between two suitably arranged ionically conductive layers in the sensor can be changed by acceleration of the mass. It may be expected that a sensor based on piezoresistivity can also be used to detect acceleration, based on the displacement of the sensor material.

The sensor or sensing elements described herein can be provided in different shapes and arranged in different patterns depending on the particular application. For example, the individual sensing elements may be shaped, as illustrated in the drawings, into bands, strips, or plates. The individual sensing elements may also be provided in the forms of buttons, rings, or sheets with various shapes such as circular, oval, square, rectangular, or irregular shapes. The sensing elements may be arranged to form a matrix. Sensing elements in the forms of elongated strips, bands or the like may be overlaid in rows and columns, or may be inter-woven. Sensing elements in the form of buttons, keys, short bars, or the like may also be laid on the same surface on a substrate in a checkerboard pattern, or a two-dimensional matrix pattern.

Signals from a given array, matrix, or another pattern of sensing elements may be processed using a conventional signal processing technology, such as those used in conventional sensors, touch sensors, touch screens, or the like.

Figure 13:
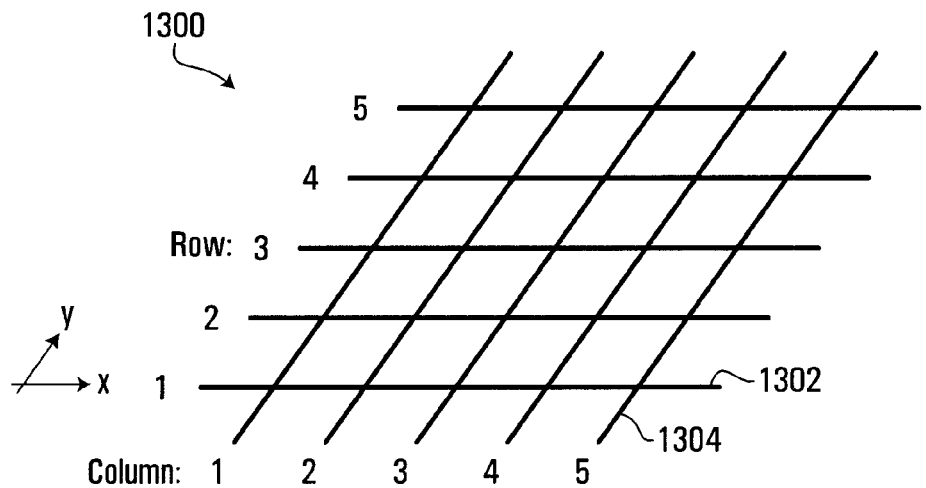
FIG. 13 is a schematic perspective view of a sensor matrix, illustrative of an embodiment of the present invention.

An example of an x-y matrix 1300 formed by rows 1302 and columns 1304 of sensing strips is illustrated in FIG. 13. The sensing strips may be constructed according to any embodiment described here. While a 5-by-5 matrix is shown in FIG. 13, in different embodiments, the sensor matrix may be any n-by-m matrix, where n and m can be the same or different numbers.

The different rows and columns of sensing elements may be connected to and sequentially read by a readout circuit (not shown). The matrix may be scanned sequentially row-by-row and then column-by-column, or vice versa. For faster readout when the matrix is large, multiple readout circuits (not shown) may be used simultaneously, each for scanning a respective sub-area in the matrix.

Figure 13A:
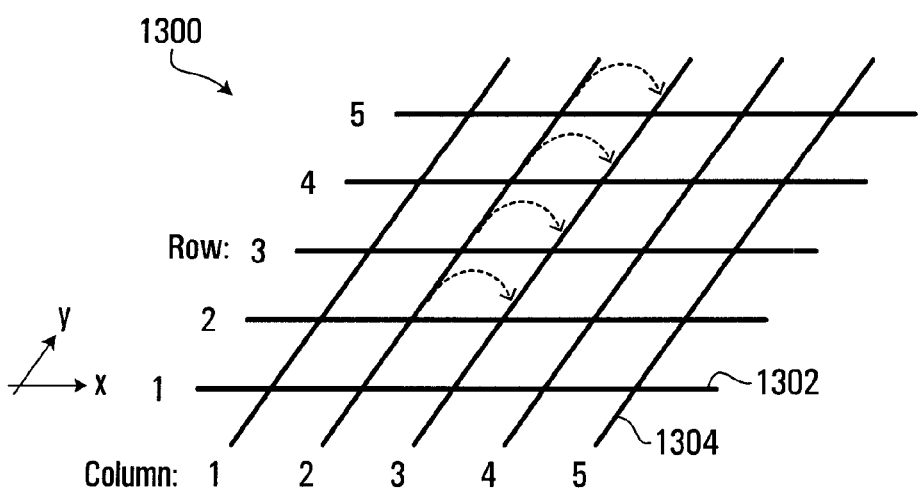
FIGS. 13A, 13B, and 13C are schematic perspective views of the sensor matrix of FIG. 13, illustrating its possible operation.

For example, when the sensing strips in matrix 1300 are proximity sensors constructed as illustrated in FIG. 1, the signal readout process may be carried out as follows, and as illustrated in FIG. 13A. In a first step, the horizontal position (in the x-direction) of any object in the proximity of the sensor surface may be determined by scanning the readouts from the column sensing strips. A pair of sensing strips positioned immediately adjacent to each other, e.g. column 2 and 3 as shown in FIG. 13A, are set as drive and sense electrodes. While it is possible to connect and detect signals from a large number of adjacent pairs of drive and sense electrodes at the same, it may be more effective or efficient to scan through the conductive strips in sequence one pair after the other, such that only one pair is active at any given time. Such scanning can be performed very fast using known data processing and detection technology. The electric field coupling between the specific pair (represented by curved arrows) is decreased when a finger is in close proximity of the gap between the specific pair, as discussed above, which decreases the capacitance readout between the pair of electrodes. That is, when a finger is near the gap between the pair of columns 2 and 3, the presence of the finger in this horizontal coordinate would be indicated by the readout from this pair. After the pair of columns 2 and 3 is measured, the pair of columns 3 and 4 may be next measured. This process can continue until all column pairs are measured (scanned) in sequence. Such scan can provide a map of the electric field distortions. After the complete picture is obtained, the driver software can interpret the measured data to determine if a finger is present at a specific horizontal location by analysing which pairs of sensing strips had their electric fields undistorted, and which pair(s) had theirs electric fields distorted.

Figure 13B:
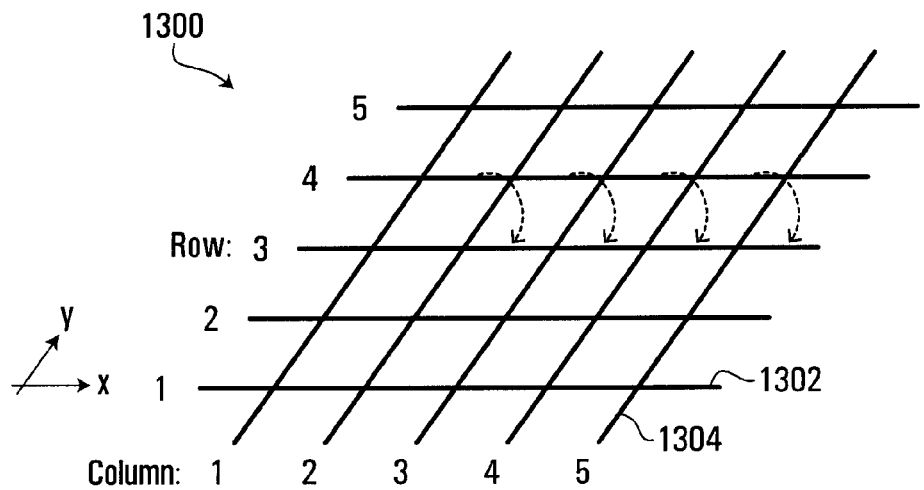

A similar scanning process can be performed for detecting the presence of a finger in the vertical location (in the y-direction). In the second step, the vertical position of the finger is determined by scanning the readouts from pairs of row sensing strips (the electric field coupling them being represented by curved arrows). As illustrated in FIG. 13B, if the finger is at the gap between rows 3 and 4, the readout from the pair of rows 3 and 4 would indicate a decrease in capacitance.

As a result, if the electric fields shown in FIG. 13A and FIG. 13B are the ones that are distorted, as concluded after scanning all pairs of adjacent row and column electrodes, it may be determined that a finger is present near the surface at the cross-point of columns 2 and 3 and rows 3 and 4. It may also be used to determine a "light touch" since, in such case, the change in capacitance brought about by the distortion of the electric field will be much larger than a hovering finger.

An advantage of the sensor arrangement and data processing method describe above is that a large area can be available for coupling between the pair of conducting elements under processing, which would give rise to a more pronounced relative change in capacitance ($\Delta C/C_0$) caused by an intruding object, and hence an enhanced sensitivity. However, when the number of data points to be processed is large, to perform the process described above and illustrated in FIGS. 13A and 13B the readout circuit will need to be able to handle the required data gathering and processing, and the time required for data gathering and processing may be relatively long.

In a different embodiment, the location of a finger in the proximity of the matrix may be determined in a different process, in which the direction of capacitance change ($\Delta C$) is taking into consideration. For instance, an increase in capacitance may indicate a touch while a decrease may indicate the presence of an object in proximity.

Figure 13C:
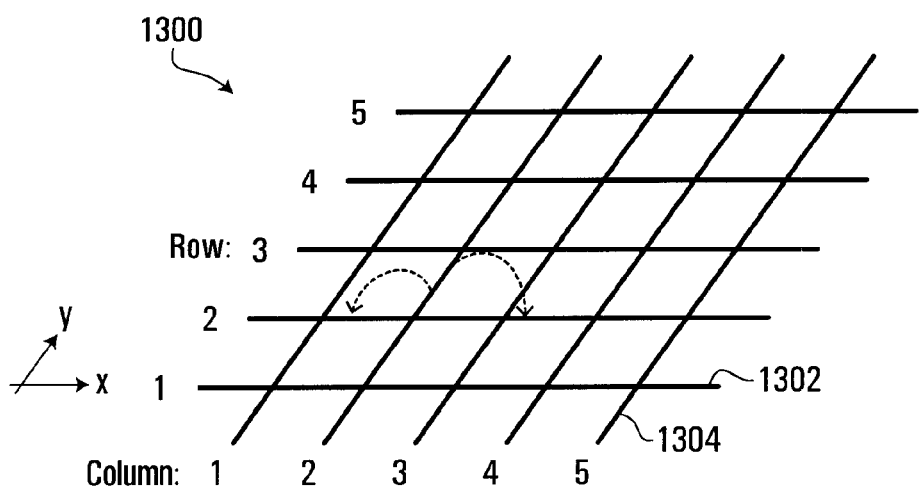
Figure 13D:
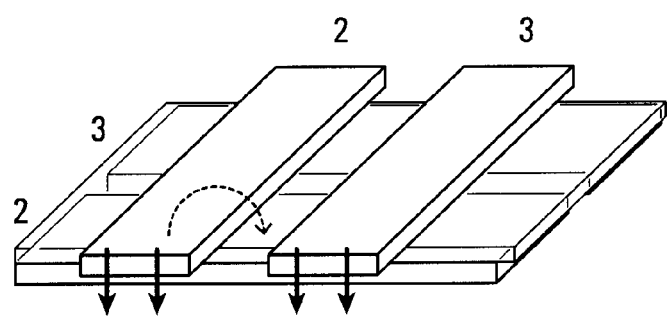
FIG. 13D is a partial view of the sensor matrix of FIG. 13, illustrating its possible operation.

Possible data processing steps are illustrated in FIGS. 13C and 13D. FIGS. 13C and 13D show the electric field coupling between the overlapping portions of the sensing strips at the row-column cross points. For example, as shown in FIG. 13C the overlapping portions between column 2 and row 2 can form a capacitor. When a voltage is applied to this pair of sensing strips, a fringing electric field is produced at the edges of column 2 and row 2, and disturbance to fringing field caused by the presence of a foreign objection in proximity can cause a decrease in the measured capacitance at the cross point of column 2 and row 2, as discussed earlier. This field can thus be exploited to detect the change in coupling to detect the presence of a finger in close proximity.

As shown in FIG. 13D, when the top sensing strip is pressed downward by a finger, the capacitance at the cross-point increases, as discussed above. Thus, scanning all the cross-points can also determine at which cross-point there is a physical touch.

As a positive $\Delta C$ detected at a sensing location indicates a touch, and a negative $\Delta C$ indicates the presence of a foreign object in proximity, the detection of both touch and proximity can be obtained in one scan. In this case, however, the magnitude of detectable $\Delta C/C_0$ may be relatively small due to reduced coupling area. Although in the process illustrated in FIGS. 13C and 13D, the coupling area between the active pair of sensing strips is smaller, as compared to that in the process illustrated in FIGS. 13A and 13B, the $\Delta C/C_0$ value is still large enough to detect the presence of a finger. The process illustrated in FIGS. 13C and 13D can be much faster, and simpler to implement.

With overlaid layers of conductive elements for proximity sensing, care should be taken to avoid or limit interference or shielding effects between the different conductive layers. One measure that may be taken is to limit the thickness or distance between the different layers. For example, when a dielectric layer is placed between a top conductive layer and a bottom conductive layer, the dielectric layer may be thin, such as having a thickness of 500 μm to 800 μm.

Figure 18:
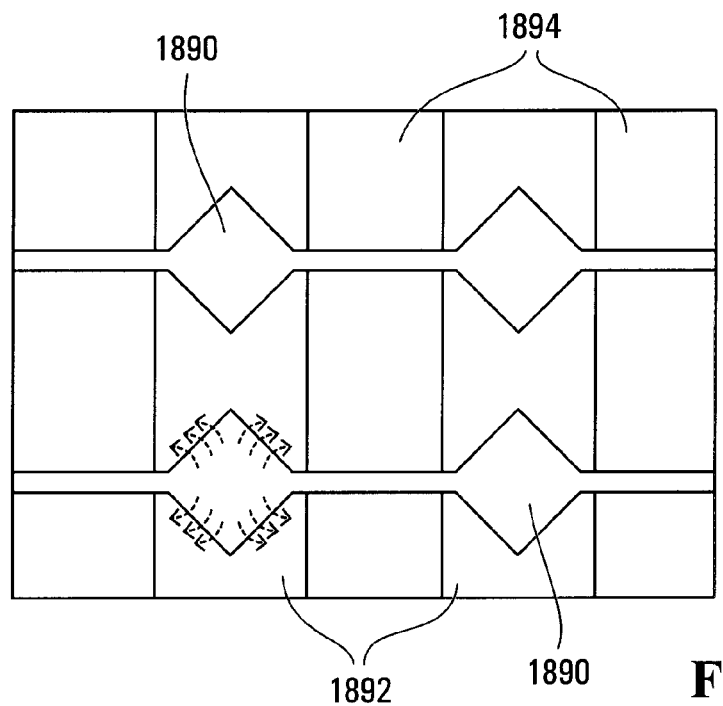
FIG. 18 is a schematic top plan view of a sensor arrangement, illustrative of an embodiment of the present invention.

The density and coverage of the top conductive elements may also be selected with a view to limit shielding effects. For example, in an embodiment the shapes and sizes of the top conductive elements may be selected as illustrated in FIG. 18, in which the "top electrodes" are ionically conductive elements 1890 as replacements for the top conductive elements discussed earlier, and the "bottom electrodes" are similar bottom ionically conductive elements 1892 as discussed earlier, separated by dielectric 1894. In particular, the diamond shaped top conductive elements provide increased edge coupling (represented by curved arrows) between the top and bottom conductive elements when a pair of top and bottom elements are used as a proximity sensing capacitor, and provide reduced interference when a pair of the bottom conductive elements are used as a proximity sensing capacitor.

Figure 19:
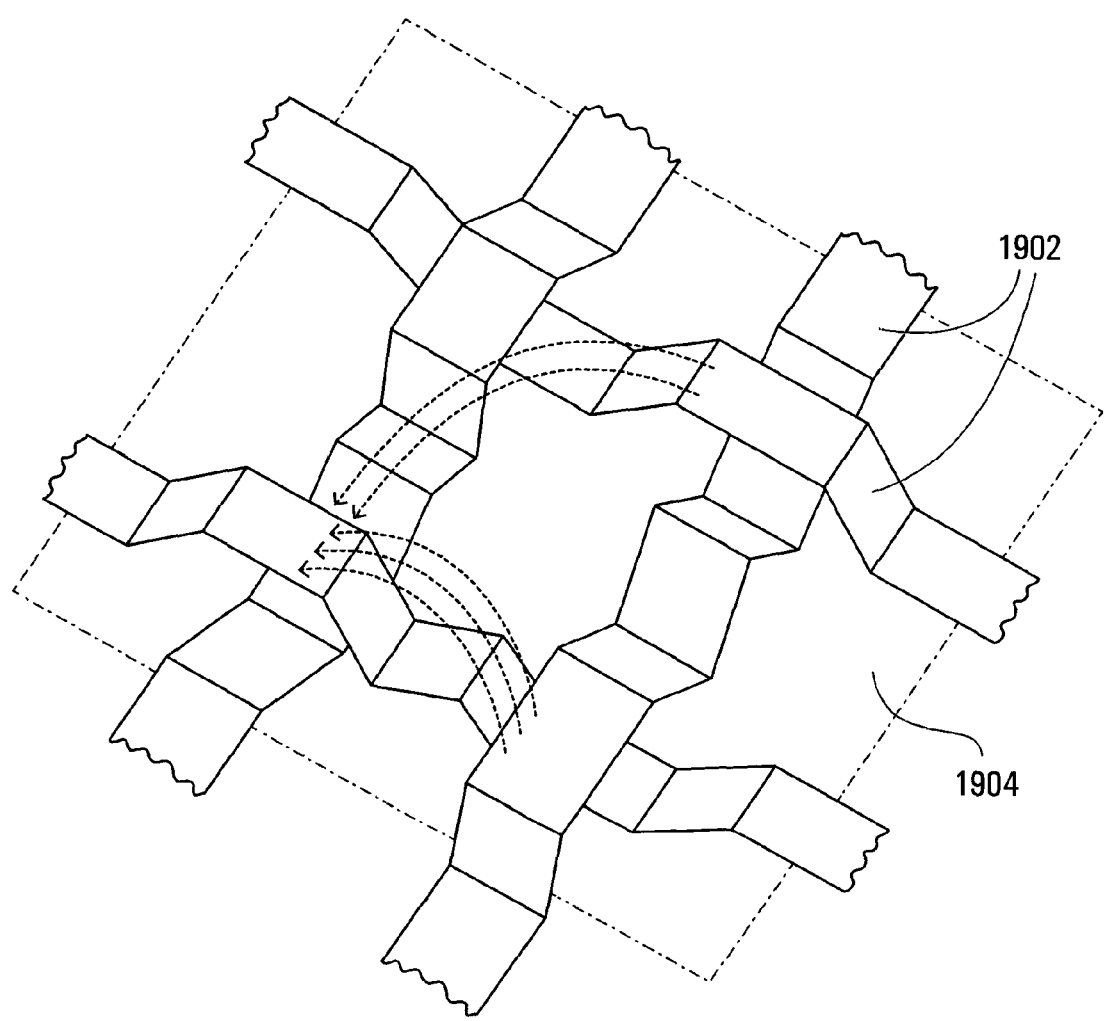
FIG. 19 is a schematic perspective view of a sensor arrangement, illustrative of an embodiment of the present invention.

A further possible modification to the sensor arrangement discussed earlier is to arrange the sensing strips in an interwoven architecture. An example is illustrated in FIG. 19. In this embodiment, the column sensing strips 1902 are placed alternately above or below the row sensing strips, with a dielectric layer 1904 placed between each pair of oppositely facing top and bottom portions of sensing strips. This arrangement may require sufficient spacing between the adjacent rows or column strips to allow for the transition of the strips from the top layer to the bottom layer or vice versa through the middle dielectric layer. It is expected that this embodiment can allow enhanced electric field coupling (represented by curved arrows), and allow different detection and readout schemes.

Figure 18A:
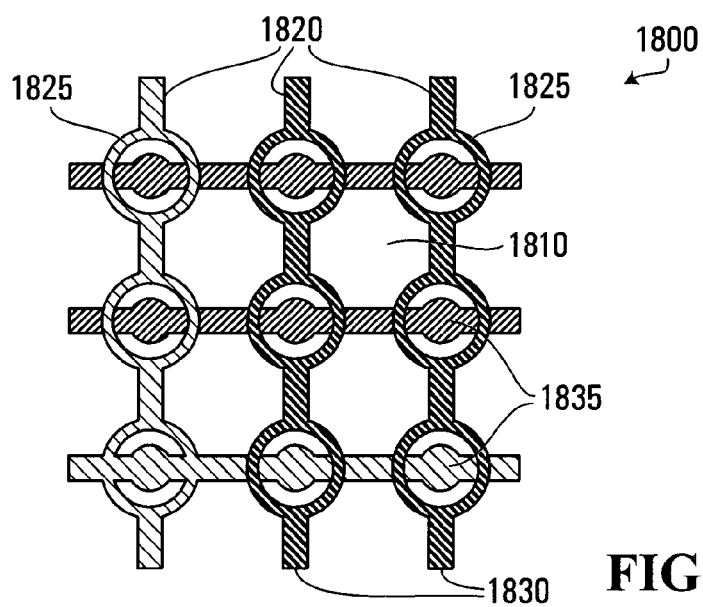
FIG. 18A is a schematic top plan view of a sensor arrangement, illustrative of another embodiment of the present invention.

The skilled person will appreciate that design of the electrode itself may be important in determining performance of the mutual capacitive sensor. Referring to FIG. 18A, a sensor with an alternative electrode design is shown generally at 1800. Sensor 1800 includes at least two layers of conductive elements (electrodes) separated by dielectric 1810. The electrode conductive element in one layer comprises a first portion having a shape complementary to a corresponding portion of a conductive element in an adjacent layer. More particularly, upper layer conductive elements 1820 include loops or rings 1825 that are complementary in shape to disc-shaped portions 1835 of lower layer conductive elements 1830. The circumference of disc-shaped portions 1835 may be less than the inner circumference of loops 1825, such that the disc-shaped portions fit within the ring structure. This design will decrease the coupling of electric field through dielectric 1810 and increase the coupling at the fringe. This results in greater electric field exposed that can be manipulated by a finger, which in turn means a larger $\Delta C/Co$ for the presence of a hovering finger or a finger touching it. This may enable better sensitivity for both proximity and touch sensing.

Figure 18B:
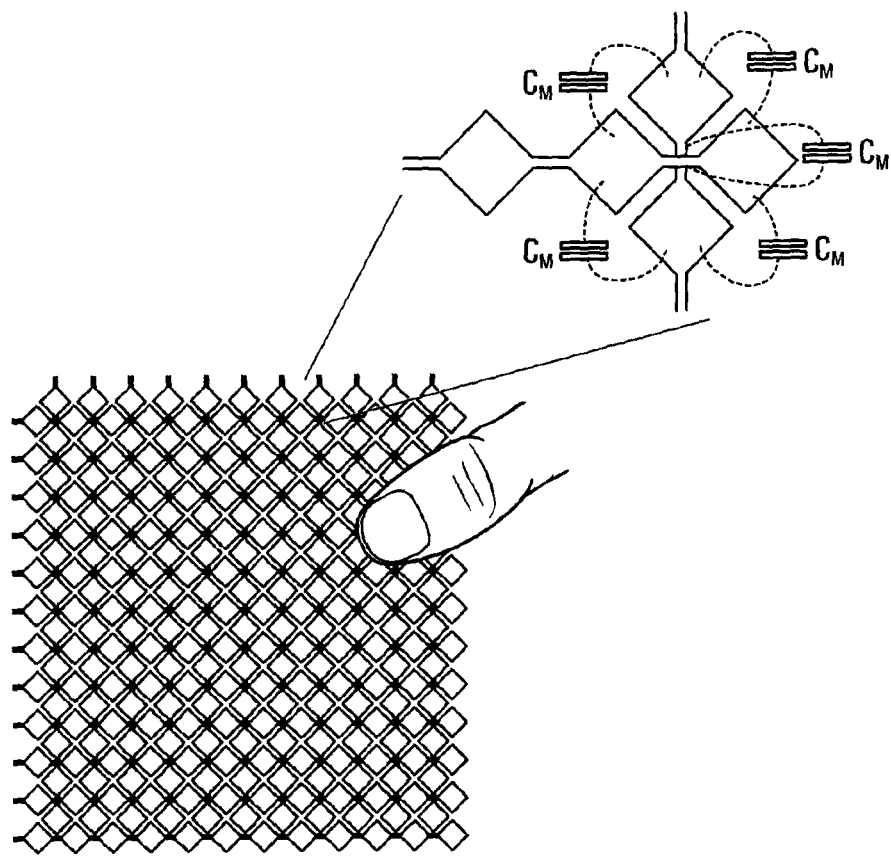
FIG. 18B is a schematic top plan view of a sensor arrangement, illustrative of another embodiment of the present invention.
Figure 18C:
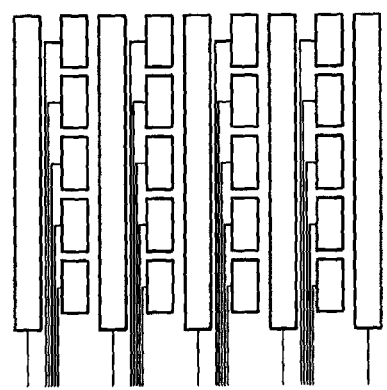
FIG. 18C is a schematic top plan view of a single-layer sensor arrangement, illustrative of another embodiment of the invention.

In addition to these designs, conventional mutual capacitance-based designs that are well established in the art may also be used in the implementation of the sensors disclosed herein as shown in FIG. 18B. Moreover, the skilled person understands that there may be no absolute need for two layers of electrodes to be separated by a dielectric. A single layer design as shown in FIG. 18C may also be used.

Figure 20:
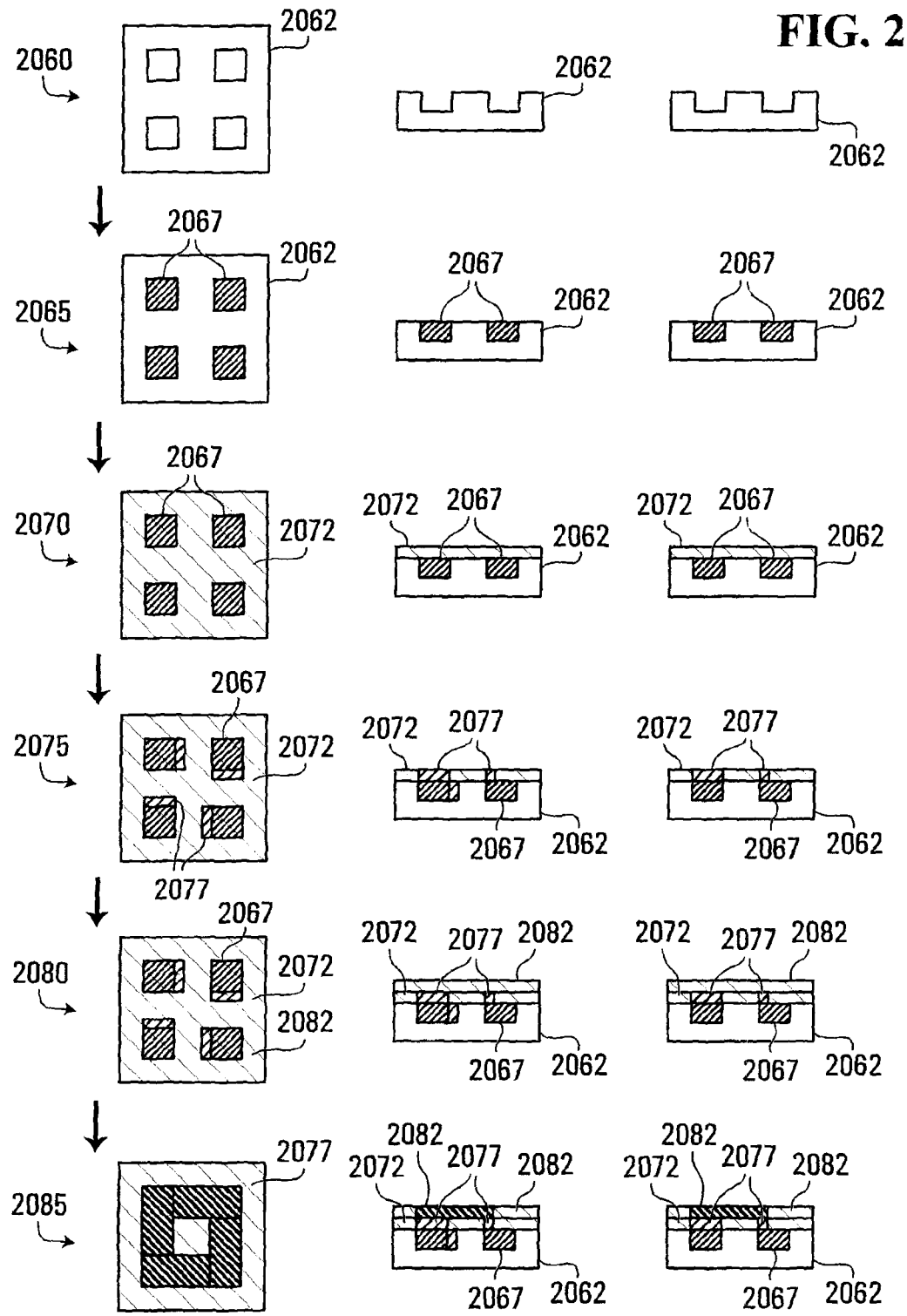
FIG. 20 shows various schematic views illustrating a process for forming the sensor arrangement of FIG. 19.

A process for forming the sensor structure in FIG. 19, is illustrated in FIG. 20. The process begins at 2060 by molding, using a metal or other suitable mold, a dielectric substrate 2062, e.g a PDMS (a transparent flexible polymer) substrate, for encapsulating an entire sensor having grooves where the electrodes are formed. The process continues at 2065 with depositing an ionically conductive hydrogel 2067 onto the dielectric substrate 2062. At 2070, another dielectric layer (possibly PDMS) 2072 is next deposited on top of the hydrogel 2067 and the substrate 2062. At 2075, conductive contacts 2077 are formed through holes 2078 created (such as by etching) in the dielectric layer to connect to the deposited (bottom) hydrogel element. At 2080, another dielectric layer (possibly PDMS) 2082 is next deposited on top of the previous dielectric layer 2072, and is patterned to form cavities for the top conductive elements. At 2085, the hydrogel material is deposited in the patterned regions/cavities to form top conductive elements 2087, thereby forming a woven hydrogel structure.

Figure 20A:
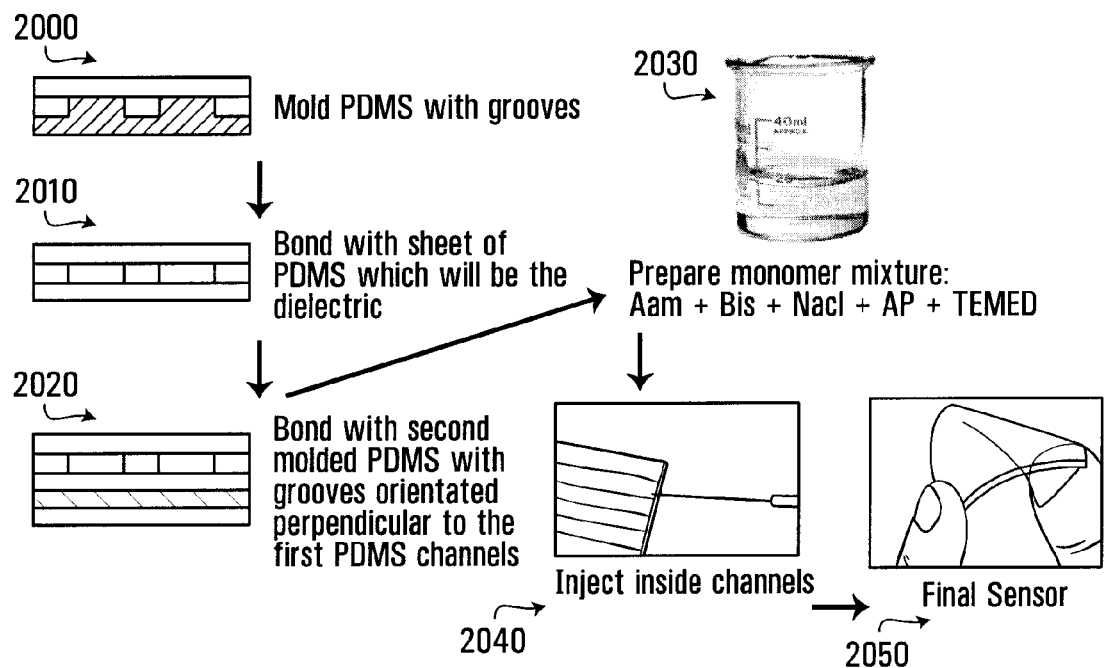
FIG. 20A is a flow diagram illustrating a method of fabricating a sensor according to an embodiment of an invention disclosed herein.

Another method of fabricating a sensor is shown in the flowchart depicted in FIG. 20A. At step 2000, a dielectric for encapsulating an entire sensor is molded using a metal or a suitable mold to have grooves where the electrodes are formed. This mold is then bonded with a sheet of the same dielectric at 2010. The process is then repeated on the other side of the device at 2020 to form the second layer of electrodes. At 2030, a mixture of hydrogel precursors is then prepared to be injected into the channels now formed after the bonding process. This mixture contains the monomer, the crosslinker, the reaction initiator, and an accelerator.

Normally, the hydrogel will not polymerize inside silicone channels since the silicone is hydrophobic, and hydrogel is hydrophilic, and because silicone has inhibitors of the polymerization process. In the past, surfactants like Bind Silane™ have been used to treat the surface of the silicone (PDMS) channels first to make it compatible with the polymerization. However, the present inventors have discovered that a sufficient amount of accelerator and initiator can be provided such that the polymer formed is still tough, but the polymerization happens quite fast (approximately in a minute), and such that the critical point when the mixture starts to become viscous and then a solid can be predicted. The mixture is then injected inside the channels at 2040 such that the hydrogel will polymerize inside as it flows through to allow the hydrogel to polymerize at 2050 and form the final sensor before the inhibiting effects of the silicon can manifest. Accordingly, the method disclosed herein does not require additional surfactants.

As can be appreciated, with the combination of proximity sensing and touch sensing, improved sensing performance may be obtained in some applications. For example, when a finger or stylus is hovering over a small link or selectable item on a touchscreen, the link or item may be enlarged before it is actually selected by touching. A passive stylus may appear to hover like an active stylus. An onscreen-keyboard key may be magnified as a finger or stylus is approaching it, rather than after it has been touched it. An onscreen keyboard, e.g. "swipe" keyboard, may be presented or used without touching it.

It is also possible to preview interactive objects such as an array of thumbnails without touching the screen. The sensors can also be arranged and configured to sense multi-finger gestures for more complex operations.

In addition, the proximity data from an array of sensors can be used to enable seamless interactive experience for the users.

Further, when the sensor or sensing elements are used in flexible devices that could be folded or stretched, the combined sensing can allow differentiation among folding/wrapping of the flexible sensor, an object approaching the sensor, or touching of the sensor by the object.

Specifically, on a flexible and stretchable surface, capacitance can change when the interface is stretched or bent, as well as when it is touched or a finger approaches. Differentiation of these states can prevent false detection or activation, and could be important in some applications.

With a sensor or sensing element with combined proximity and touch sensing as disclosed herein, such differentiation may be realized as different states results in different combination of changes in capacitance, as summarized in Table I.

TABLE I

| | Proximity Capacitance | |
| --- | --- | --- |
| | Decrease | Increase |
| Touch Capacitance No change | Object in proximity | |
| Touch Capacitance Decrease | | Convex Folding |
| Touch Capacitance Increase | Touch or Concave folding or Stretching | |

Thus, the different states may be identified based on Table I.

In one possible method for distinguishing the state of the interface, the state may be determined as follows.
  A. The detection of proximity changes is achieved when proximity capacitance alone decreases.
  B. Touch leads to a large decrease in proximity capacitance, and an increase in touch capacitance.
  C. Folding with positive curvature (convex folding as shown in FIG. 14C) is characterized by an increase in proximity capacitance, and a decrease in touch capacitance. It can thus be distinguished from proximity alone and from physical touch. Touch capacitance is decreased since the capacitive touch sensors at the surface are compressed in one direction, reducing area. At the same time the separation between the conductive elements (plates) increases.
  D. Folding with negative curvature (concave folding) produces a decrease in proximity capacitance and an increase in touch capacitance. This can be distinguished from physical touch using either time or spatial information. In the time case, if it is known that either the adjacent cells were touched, or approaching proximity was observed, then the sense signals are due to touch. The spatial version is described below.
  E. Stretching leads to a decrease in proximity capacitance and an increase in touch capacitance. This effect can be distinguished from others because it is characterized locally by uniform change in all directions.

As can be noted in TABLE I, the directions of capacitance change are similar for touch, concave folding and stretching. To discriminate among these states, spatial information can be used as follows.

Figure 14A:
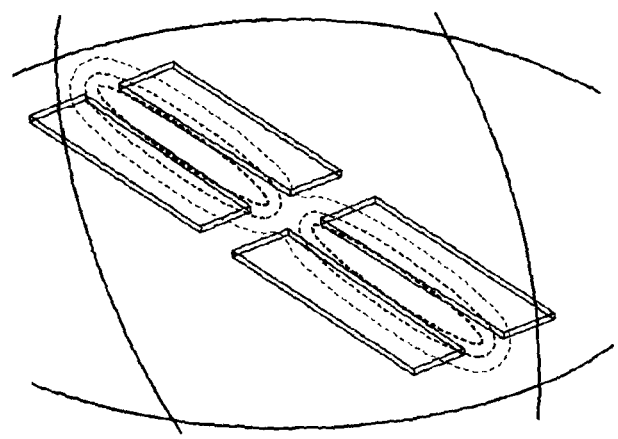
FIGS. 14A, 14B and 14C are illustrations of photographs of computer simulation images illustrating electric field distribution around conductive elements.
Figure 14B:
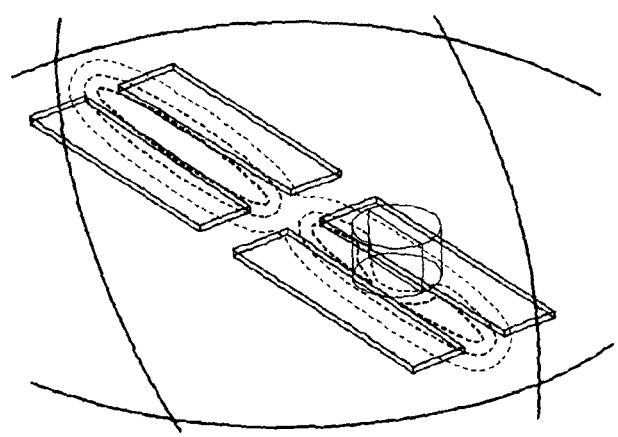
Figure 14C:
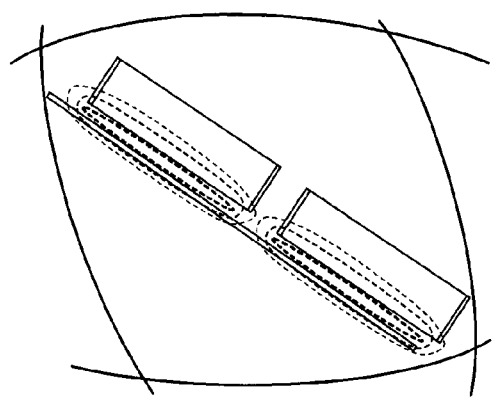

To demonstrate the difference in readout from an array of adjacent proximity capacitive sensors, it is assumed that the sensor array has a set of two sensors (as illustrated in FIGS. 14B and 14C). An approaching finger will distort the electric field between the respective pair of conductive elements leaving the other sets of conductive elements in the sensor array minimally affected, as shown in FIG. 14B. When the whole sensor is bent/folded, as shown in FIG. 14C, the electric field from both sets of electric fields are distorted which thus enables differentiation between an approaching finger versus a concave fold/wrap. As noted above stretching can be distinguished from folding/wrapping as it typically leads to changes in all directions over a larger area.

Self Capacitance

Figure 21:
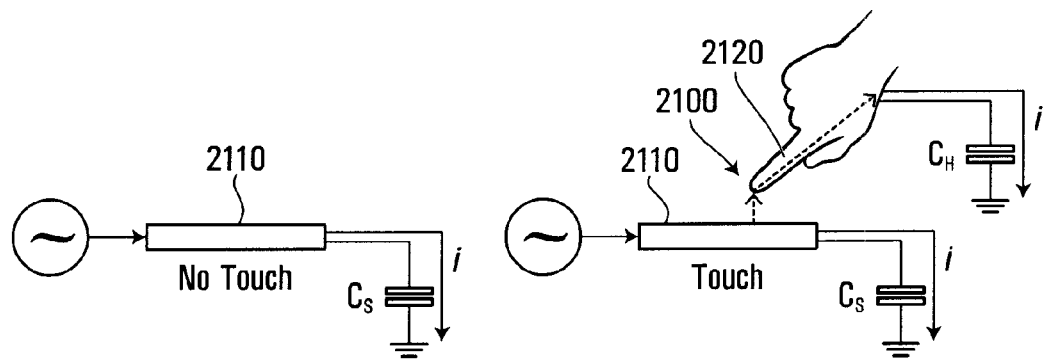
FIG. 21 shows a schematic view of a self-capacitive sensor, illustrative of an embodiment of an invention disclosed herein.

This disclosure also relates to sensors relying on "self capacitance". "Self capacitance" as used herein, refers to sensing involving capacitors formed by a single, sensing electrode and an object to be sensed. For example, as illustrated in FIG. 21, a capacitor 2100 is formed by the interaction of a first sensing electrode 2110 with an approaching object 2120, e.g. a finger, which acts as a second electrode. When there is no finger the sensor is in steady state. As object 2120 approaches first sensing electrode 2110, an electric field coupling develops between the first sensing electrode and the object, and the electric field goes through the finger into the ground to complete the circuit. As object 2120 approaches, the coupling increases and thus increases the capacitance. This increased capacitance can be used to detect the object.

Figure 22:
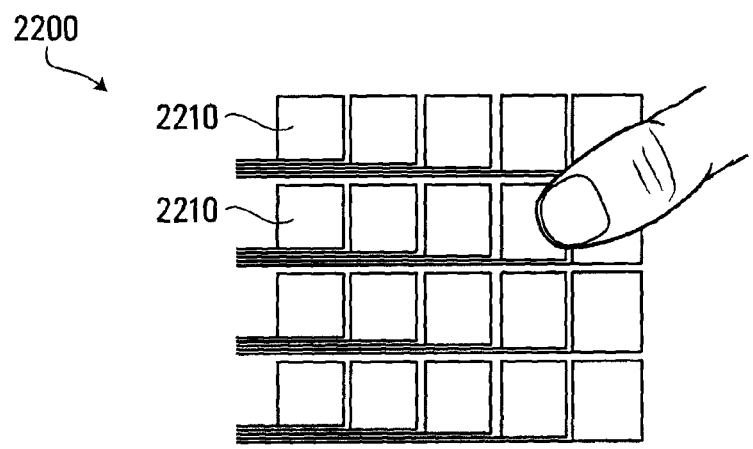
FIG. 22 shows a top schematic view of an array of electrodes of a self-capacitive sensor illustrative of an embodiment of an invention disclosed herein.
Figure 23:
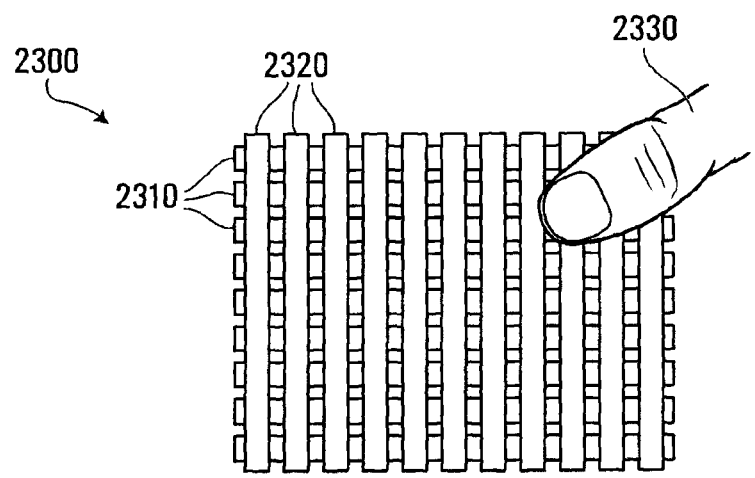
FIG. 23 shows a top schematic view of an array of electrodes of a self-capacitive sensor illustrative of an embodiment of an invention disclosed herein.

Generally speaking, an array is required for self capacitive detection of an object hovering proximal to a surface. Referring to FIG. 22, an array 2200 may include pads 2210. However, such arrays would require a large number of electrode connections, and thus may be difficult to scale up. Referring to FIG. 23, an alternative array is shown generally at 2300. In this grid-type implementation, rows 2310 and columns 2320 of electrodes separated by a dielectric. An approaching object, e.g. finger 2330, at an intersection of a column and row excites the row and column electrodes independently. This information may be used to provide the location of the object proximal to the surface. This grid-type array would require fewer electrode connections than the pad-type array illustrated in FIG. 22.

Figure 24:
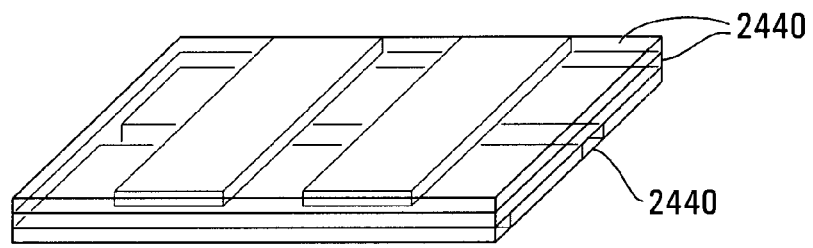
FIG. 24 shows a schematic perspective view of an array of self-capacitive electrodes encapsulated with a dielectric according to an embodiment disclosed herein.

Referring to FIG. 24, if the array illustrated in FIG. 23 is encapsulated with a dielectric 2440, a finger can touch the surface of the sensor, which will give rise to a further increase in capacitance. The increase in capacitance can be used to differentiate between a hovering finger versus a finger touching the sensor.

Figure 25:
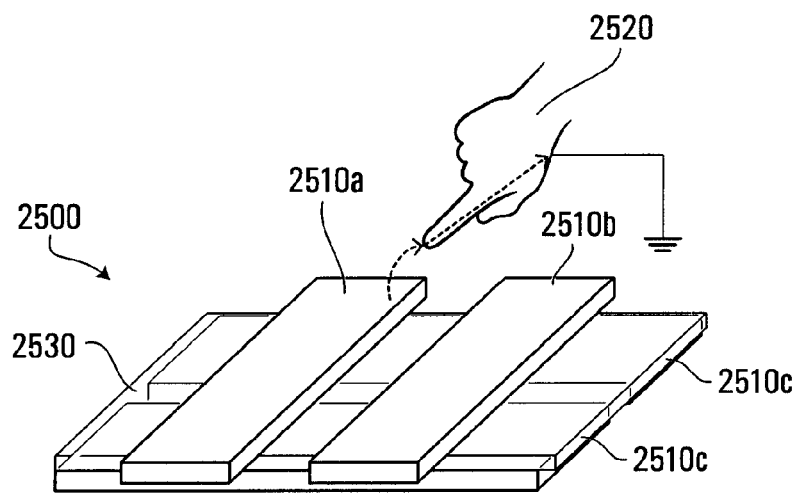
FIG. 25 shows a schematic perspective view of a self-capacitive sensor according to an embodiment disclosed herein.

Referring to FIG. 25, a portion of a sensor array 2500 comprising antiparallel layers of hydrogel electrodes (2510a, 2510b, 2510c, and 2510d) separated by a dielectric 2530 is depicted. An excitation signal is applied to electrode 2510a to read out the electrode. As finger 2520 approaches electrode 2510a, the capacitance increases. This process is repeated for each electrode and until the entire array has been scanned to obtain a ΔC/Co map, which allows the position of finger 2520 to be located.

It can be appreciated and understood that various modifications and alternatives to the embodiments disclosed herein are possible.

Ionically conductive polymers such as hydrogels can be conveniently produced and used in sheets with varying thickness. It is possible to have a thickness in the range of 1 μm to 10 cm, or even thicker. The polymer can also be quite tough (difficult to break). For example, a suitable polymer may be stretched to 21 times of its normal length without rupture. These properties may be utilized to provide physical protection to the device in which the sensor is embedded. There are also some advantages of using a thick flexible sensor membrane.

The above properties also provide an advantage over other conventional sensor materials such as silver nanowires (AgNW) or metal mesh sensors, which, for example, are not as stretchable as a hydrogel.

In some applications, it may be desirable to encapsulate the sensing elements or the sensors, for example, to prevent loss of fluids from the hydrogel materials, particularly when the hydrogel materials contain water as a medium for charge transportation. The entire device or sheet in which the sensor is embedded may be encapsulated. For example, protective films or coatings may be applied to the top or bottom surfaces of the device or sheet. Any suitable protective film or coating may be used. For example, a dielectric gel material may be used as the encapsulation material. In some embodiments, DOW CORNING™-3-4154 dielectric gel may be used as the encapsulation material. In some embodiments, a parylene may be used as the encapsulation material.

In selected embodiments, it may be desirable to use a solid polymer electrolyte in the ionically conductive elements of the sensor. For example, a polyethylene oxide (PEO) may be a suitable replacement for ionically conducting hydrogels, as it is a solid polymer and has a relatively high ionic conductivity. PEO may be mechanically strengthened with elastomer interpenetrating layers and the strengthened PEO can be robust. When, a solid ionic conductive polymer is used, the need for encapsulation may be reduce or even eliminated. As the ionic conductivity of a solid ionic conductive polymer can be significantly lower (up to two or three orders of magnitude) than that of an ionically conductive hydrogel, the solid ionic conductive polymer may be used in applications where the conductive path to be provided by the polymer is relatively short, so that sufficient electrical signal strength can still be maintained when the sign is transmitted across the path.

It is also noted that when an ionically conductive hydrogel is used to transmit electrical signal, care should be taken to limit electrochemical reaction in the hydrogel or at the interface of the hydrogel and an adjacent contact layer. Significant electrochemical reaction can substantially reduce the lifetime of the conductive material. For example, to limit or prevent electrochemical reaction, the sensor should be configured and operated so that the voltage applied to the sensor is not too high to overcome the potential difference established by the electrical double layers formed at the interface between an ironically conductive layer and an adjacent electrically conductive layer in contact with the ironically conductive layer. When the applied voltage is too high and can overcome the electrical double layer, electrons and ions can cross the interface, and electrochemical reactions will occur. When the applied voltage is low, the electrons and ions do not cross the interface, and no electrochemical reaction will occur. Thus, the sensors may be designed to limit the voltage applied across any interface between an electronically conducting layer (e.g. a contact electrode) and an ionically conducting layer.

When a hydrogel is used as a resistive strain sensor, such as in the sensor 900 described above, electrochemical reactions may be avoided by applying a low voltage AC signal to the sensor.

The sensors and sensing elements described herein may be used in flexible or wearable electronics, particularly those that require the sensors to be transparent and flexible.

Flexible transparent tactile sensor can be useful in a wide variety of applications, and there has been extensive research in this area. Conventional flexible sensors are typically not highly transparent, and often require expensive or unusual transparent conductive materials. They may also require complex fabrication processes, and may not be conformal or biocompatible with many environments in which flexible transparent sensor are to be used.

In comparison, with proximity sensors formed from ionically conductive polymers as described herein, one or more of the above shortcomings of the conventional sensors may be conveniently avoided. Further, many suitable ionically conductive polymers are inexpensive and are relatively convenient to produce or obtain.

As discussed above, in a sensor disclosed herein, a capacitive sensor may have a trilayer structure, including a transparent, flexible dielectric layer sandwiched between two layers of transparent, flexible, ionically conductive polymer, which may be a hydrogel soaked in a salt solution. The polymer material may be inexpensive. However, one or more additional layers or coatings may be provided above or below, or between an ionically conductive layer and the substrate or a dielectric layer.

As can be appreciated, the sensors and sensing elements described herein may be used in touchscreens. The combination of proximity and touch detection can enhance the touchscreen performance. With the combined information, it is possible to provide smooth, streamlined response and reduced latency, and to allow activation by use of a glove or an object other than a human finger or specially designed stylus. In addition, a passive stylus or finger may be used to activate certain actions or functions by hovering over the screen without actually touching the screen. For example, hovering a stylus over a specific item on the screen may trigger a proximity sensor and a zooming action to enlarge the item, so it can be then tapped to select it.

While examples of polymeric ionically conductive materials have been disclosed and discussed, it is expected that in some applications non-polymeric ionically conductive materials may also be used to form the conductive elements in the sensors or sensing elements. For example, aerogels may be suitable replacement for ionically conductive polymeric hydrogels. Aerogels can be ultra-lightweight and highly porous. They are typically derived from wet gels of inorganic oxides by supercritical or freeze drying. Such drying processes allow the liquid in the gel to be slowly removed without causing the solid matrix in the gel to collapse from capillary action, which could happen in other evaporation processes. Example aerogels may be produced from silica gels, alumina, chromia and tin dioxide. Some aerogels are not suitable for use in the presence of water, but an aerogel that absorbs water has also been reported in the literature. Aerogels may be used with a non-polar solvent, such as suitable ionic liquids, to provide the medium for ion transportation. Conveniently, when a highly porous, low density aerogel is used, the conductive element may have a relatively high ionic conductivity. A higher conductivity can enable the use of a larger coupling area without the need for metal conductor contacts, or the use of very thin layers of ionic conductors to achieve the same level of electric resistance. When aerogels are made in thin layers, they may be bendable. Some aerogels are also transparent.

Sensors disclosed herein may also be used with rigid or semi-rigid devices or devices with rigid or semi-rigid surfaces.

For example, the ionically conductive materials disclosed herein may be used to replace ITO conductors. Compared with ITO materials currently used in touchscreen displays, some conductive hydrogels can potentially provide higher transparency with similar or even better sheet resistance. For example, for an 11 mm thick layer of a hydrogel, its transparency can be 98.9% (minus 2% due to surface reflection), and its sheet resistance can be on the order of 40 Ohms per square. In comparison, typical transparency of ITO materials used touchscreen display can be as low as 95%.

ITO is currently used in many large-area devices. However, the costs for applying ITO onto large areas are typically high. In comparison, many hydrogel materials may be conveniently applied over large areas at relatively low costs.

In some applications, the sensors do not need to be transparent. For example, floor sensors placed under a floor, carpet or floor mat, which can be used to detect the presence, location, or movement of people, do not need to be transparent. Similarly, the sensors disclosed herein may be used as wall sensors, in door knobs, or in wearable devices. In these applications, the sensors also may not be transparent.

In the figures, the sensors and their components are illustrated with schematic views and diagrams here. For practical applications, other components and materials may need to be included as can be understood by those skilled in the art. For example, the top surface or layer of a sensor, or a device in which one or more sensing elements are embedded, may be flat or smooth. To achieve a flat layer surface, non-conducting filler materials may be used to fill the gaps between adjacent conductive elements, electrodes, or electric contacts. Filler or other additional materials may also be used for other reasons or to achieve other functionalities, such as a protective coating or to provide a desired appearance or property such as mechanical strength. The filler material may also be transparent and flexible depending on the application. Such additional materials may be rubbery materials such as PDMS. In some embodiments, the optical index of the materials used in the sensor or device may be matched to that of the ion conductors in the range of visible wavelength.

It may also be beneficial to have an anti-reflection coating or film on the surface of the sensor or device. For example, the anti-reflection may be composed of a standard ¼ wave plate. In some embodiments, the materials may be selected so that they have an intermediate index of refraction between air and the ionic conductor used. For instance, an index close to that of water for a hydrogel may be selected.

Also as noted earlier, protective covers may be used to encapsulate sensors or sensor devices to prevent leakage or loss of electrolytes. Conveniently, a cover material may be selected to provide multiple functions including those discussed above.

Some ionic membranes that are suitable for use as conductive elements in selected sensors may have a similar chemical structure, but with different chain lengths. For example, fluorinated hydrocarbons with side chains of differing lengths may be suitable. Some commercially available membranes and their suppliers are listed in TABLE II.

TABLE II

| Cationic Ion Exchange membrane | | Anionic Ion Exchange membrane | |
|---|---|---|---|
| Name | Supplier | Name | Supplier |
| Aciplex k-192 | Asahi | Aciplex A-192 | Asahi |
| Selemion CMV | ACG Engineering | Selemion AMV | ACG Engineering |
| Nafion | DuPont | Fumasep FAS | Fumatech GmbH |
| Fumasep FKS | Fumatech GmbH | Fumasep FAB | Fumatech GmbH |
| Flemion | Asahi | Ralex MH-PES | Mega a.s. |
| Fumasep FKD | Fumatech GmbH | Morgane ADP | Solvay |
| CR61-CMP | Ionics Inc. | Neosepta AM1 | Astom Corp. |
| Ralex CM-PES | Mega a.s. | | |
| PC-SK | PCA GmbH | | |
| Morgane CDS | Solvay | | |
| Neosepta CM1 | Astom Corp. | | |

Other features, modifications, and applications of the embodiments described here may be understood by those skilled in the art in view of the disclosure herein.

The following examples are provided to further illustrate embodiments of the present invention, and are not intended to limit the scope of the disclosure.

EXAMPLES

Example I Sample Ionically Conductive Polymer

A sample ionically conductive polymer was prepared by soaking a polyurethane hydrogel in a 1.0 M KCl solution. The resulting sample hydrogel contained 90% water and had a sheet resistance of about 167Ω/□. The sample hydrogel was highly transparent, with transparency of about 93%, and stretchable.

Figure 15:
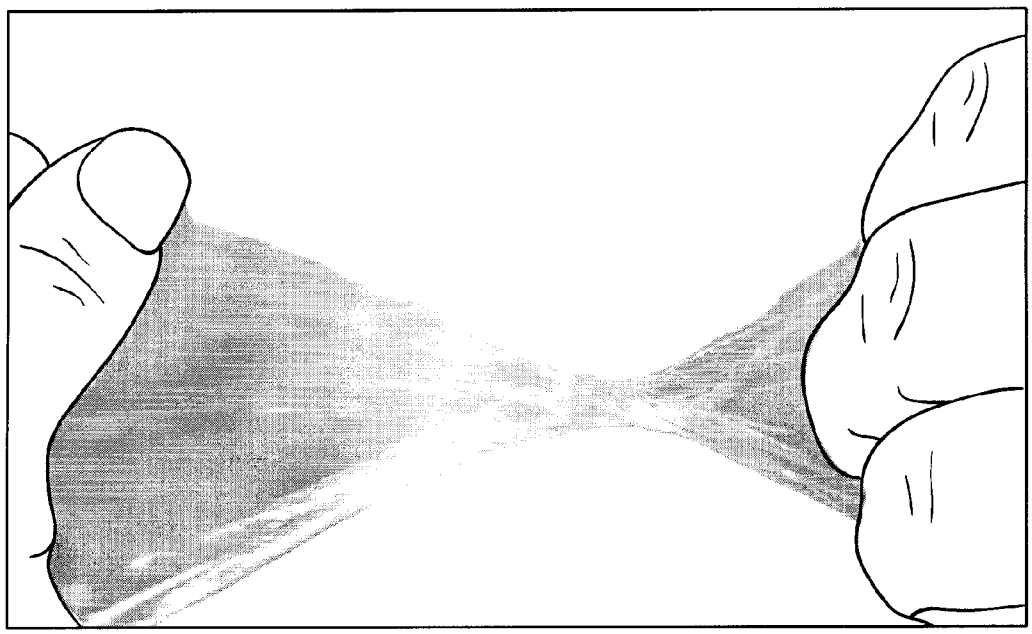
FIG. 15 is a photographic image of a sample ionically conductive hydrogel.

A representative photograph of the sample hydrogel is shown in FIG. 15.

Example II Sample Sensor

A two dimensional (2×2) sensor was fabricated using the sample polymer prepared in Example I, with a structure according to sensor 700 as shown in FIG. 7. Each hydrogel conductive element was bar shaped with dimensions of 3 cm×0.75 cm×280 µm. The adjacent conductive elements on the same layer were spaced apart by 0.75 cm. The dielectric between the conductive elements was a 800 µm thick layer of PDMS.

The sample sensor was tested for proximity and touch sensing. A grounded test tube filled with water to simulate a human finger was used as the foreign object in the test.

Figure 16:
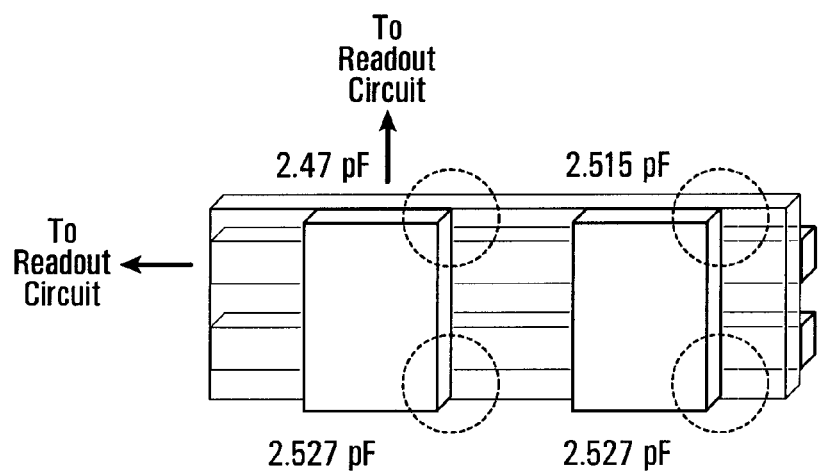
FIG. 16 is a top plan view of a sample sensor in operation.

Lateral sensitivity of the sample sensor was conducted by moving the foreign object along the horizontal direction while maintaining the same vertical distance to the sensor. A schematic diagram of the sample sensor and test setup is shown in FIG. 16. The results confirmed the lateral sensitivity of the sample sensor. In the tests, the vertical distance was 2 mm.

Figure 17:
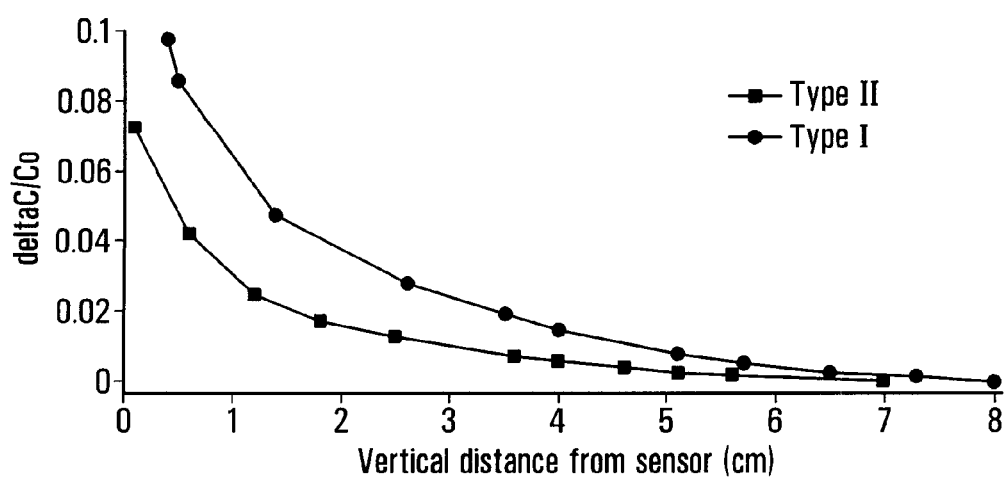
FIG. 17 is a data graph showing test results conducted using the sensor of FIG. 16.

An LCR (inductance, capacitance, and resistance) meter was used to measure capacitance changes during the test. Representative test results for capacitance response are shown in FIG. 17, which shows the relationship between the relative capacitance change and the vertical distance between the foreign object and the sensor top surface. Type I data was obtained using the readout process illustrated in FIGS. 13A and 13B. Type II data was obtained using the readout process illustrated in FIG. 13C. It is observed that the $\Delta C/C_0$ for Type I was two times that of Type II.

The results indicated that high resolution detection may be achieved with this sensor construction, based on analysis of data received from all coordinate points. The sample sensor materials also demonstrated excellent transparency. When a display screen was covered with the sensor material, the underlying displayed image was clearly seen and not significantly disturbed.

Example III

Sample gels were also obtained and tested for piezoresistivity. The sample gels achieved a relative change in resistance to touch pressure ratio of $\Delta R/R/p \sim 20/MPa$, compared to ~2/MPa in silver wire containing elastomers and less than $10^{-5}$ in metals and ceramics. This indicates that the sample piezoresistive sensor was very sensitive, as compared to other piezoresistive approaches.

CONCLUDING REMARKS

It will be understood that any range of values herein is intended to specifically include any intermediate value or sub-range within the given range, and all such intermediate values and sub-ranges are individually and specifically disclosed.

It will also be understood that the word "a" or "an" is intended to mean "one or more" or "at least one", and any singular form is intended to include plurals herein.

It will be further understood that the term "comprise", including any variation thereof, is intended to be open-ended and means "include, but not limited to," unless otherwise specifically indicated to the contrary.

When a list of items is given herein with an "or" before the last item, any one of the listed items or any suitable combination of two or more of the listed items may be selected and used.

Of course, the above described embodiments of the invention are intended to be illustrative only and in no way limiting. The described embodiments of the invention are susceptible to many modifications of form, arrangement of parts, details and order of operation. The invention, rather, is intended to encompass all such modification within its scope, as defined by the claims.

What is claimed is:

1. A sensor for sensing the proximity of an object, the sensor comprising:
    a conductive element formed of an ionically conductive polymer and operable to couple with the object by an electric field to form a capacitor, wherein the sensor is operable to sense the proximity of the object based on a change in the electric field in response to a change in the proximity of the object.

2. The sensor of claim 1, wherein the at least one conductive element is a plurality of conductive elements, wherein each pair of adjacent conductive elements is coupled by a fringing electric field to form a capacitor, wherein the sensor is further operable to sense the proximity of the object based on a change in the fringing electric field in response to a change in the proximity of the object.

3. The sensor of claim 2, wherein the plurality of conductive elements are provided in a plurality of layers of conductive elements.

4. The sensor of claim 3, wherein a conductive element in one layer comprises a first portion having a shape complementary to a corresponding portion of a conductive element in an adjacent layer.

5. The sensor of claim 4, wherein the first portion has a ring structure and the corresponding portion has a disc structure sized to fit within the ring structure.

6. The sensor of claim 2, wherein said plurality of conductive elements are arranged one adjacent to another on a substrate, and said conductive elements are connected to an alternating-current (AC) source.

7. The sensor of claim 2, further comprising a dielectric layer, wherein a first set of said plurality of conductive elements are arranged above said dielectric layer, and a second set of said plurality of conductive elements are arranged below said dielectric layer opposite to respective ones of said first set of conductive elements, thereby forming a plurality of capacitors, said capacitors connected for proximity sensing based on a decrease of a capacitance of a respective capacitor.

8. The sensor of claim 7, wherein the dielectric layer is elastic, and said capacitors are further connected for touch sensing based on an increase of the capacitance of the respective capacitor caused by compression of said dielectric layer at said respective capacitor.

9. The sensor of claim 7 wherein the first set and second set are connected for light touch sensing based on a larger decrease in capacitance of a respective capacitor compared to a proximity to distinguish between a proximity and a light touch.

10. The sensor of claim 1, further comprising a plurality of conductive elements arranged and connected for touch sensing.

11. The sensor of claim 10, wherein said conductive elements for touch sensing are formed of the ionically conductive polymer.

12. The sensor of claim 10, wherein said plurality of conductive elements for proximity sensing are provided in a first layer, and said plurality of conductive elements for touch sensing are provided in a second layer under said first layer.

13. The sensor of claim 12, wherein each one of the first and second layers is elastic, and has a transparency of more than 90% and an electric resistance of less than 200 $\Omega/\square$.

14. The sensor of claim 1, further comprising:
    one or more conductive elements arranged and connected for touch sensing by detecting resistivity changes in said one or more conductive elements, wherein said one or more conductive elements are formed of a transparent ionically conductive polymer, and are connected to an alternating-current (AC) source.

15. The sensor of claim 1, wherein said ionically conductive polymer is an ionically conductive hydrogel.

16. The sensor of claim 15, wherein said ionically conductive hydrogel comprises:
    polyacrylamide or a polyurethane; a fluid electrolyte, and said conductive elements are encapsulated to prevent loss of said fluid electrolyte; a non-volatile electrolyte; a solid electrolyte; a salt; or a combination thereof.

17. The sensor of claim 1, wherein the conductive elements are configured and connected to conduct an alternating-current.

18. The sensor of claim 1, wherein the sensor is flexible, stretchable, transparent, or a combination thereof.

19. A sensor for sensing the proximity of an object, the sensor comprising a plurality of conductive elements formed of an ionically conductive polymer, wherein each pair of adjacent conductive elements is coupled by a fringing electric field to form a capacitor, wherein the sensor is operable to sense the proximity of the object based on a change in the fringing electric field in response to a change in the proximity of the object.

* * * * *